(12) United States Patent
Numata et al.

(10) Patent No.: US 7,872,404 B2
(45) Date of Patent: Jan. 18, 2011

(54) PIEZOELECTRIC VIBRATING REED DEVICE HAVING IMPROVED ELECTRODE DESIGN

(75) Inventors: Masashi Numata, Chiba (JP); Yasuo Kawada, Chiba (JP)

(73) Assignee: Seiko Instruments Inc., Chiba (JP)

( * ) Notice: Subject to any disclaimer, the term of this patent is extended or adjusted under 35 U.S.C. 154(b) by 134 days.

(21) Appl. No.: 12/328,130

(22) Filed: Dec. 4, 2008

(65) Prior Publication Data
US 2009/0152994 A1  Jun. 18, 2009

(30) Foreign Application Priority Data
Dec. 17, 2007  (JP) ............... 2007-324155

(51) Int. Cl.
*H01L 41/08* (2006.01)
*H03H 9/215* (2006.01)

(52) U.S. Cl. ...................... 310/370; 310/348

(58) Field of Classification Search ............... 310/344, 310/348, 370
See application file for complete search history.

(56) References Cited

U.S. PATENT DOCUMENTS

| | | | |
|---|---|---|---|
| 3,697,766 A * | 10/1972 | Ganter et al. | 310/348 |
| 3,795,831 A * | 3/1974 | Fujita | 310/370 |
| 4,035,673 A * | 7/1977 | Ishida et al. | 310/344 |
| 4,384,232 A * | 5/1983 | Debely | 310/370 |
| 5,607,236 A * | 3/1997 | Takagi et al. | 310/370 |
| 5,854,427 A * | 12/1998 | Terada et al. | 310/370 |
| 2005/0104480 A1* | 5/2005 | Tanaya | 310/344 |
| 2005/0140252 A1* | 6/2005 | Miyata et al. | 310/370 |
| 2007/0090727 A1* | 4/2007 | Uetake et al. | 310/344 |

FOREIGN PATENT DOCUMENTS

| | | |
|---|---|---|
| JP | 08-298425 | 11/1996 |
| JP | 2001-144581 | 5/2001 |
| JP | 2001-217677 | 8/2001 |

OTHER PUBLICATIONS

Office Action (Non-Final), dated Jun. 11, 2010—U.S. Appl. No. 12/188,726—filed Aug. 8, 2008—(8 pgs).
Office Action (Non-Final), dated Jun. 14, 2010—U.S. Appl. No. 12/329,528—filed Dec. 5, 2008—(8-pgs).

* cited by examiner

*Primary Examiner*—Jaydi A. SanMartin
(74) *Attorney, Agent, or Firm*—Brinks Hofer Gilson & Lione

(57) ABSTRACT

A piezoelectric vibrating reed includes a piezoelectric plate made of a piezoelectric material, a pair of exciter electrodes formed on outer surfaces of the piezoelectric plate and configured to vibrate the piezoelectric plate when a predetermined voltage is applied thereon, and a pair of mount electrodes electrically connected to the pair of exciter electrodes, respectively. One mount electrode in the pair of mount electrodes is formed on one surface (under surface) of the piezoelectric plate and the other mount electrode is formed on the other surface (top surface) of the piezoelectric plate in a state not to oppose the one mount electrode with the piezoelectric plate in between. Accordingly, not only can power be saved, but also higher performance can be achieved by lowering the R1 characteristic and thereby enhancing the vibration characteristic.

11 Claims, 20 Drawing Sheets

PIEZOELECTRIC VIBRATING REED DEVICE HAVING IMPROVED ELECTRODE DESIGN

PRIORITY CLAIM

This application claims priority under 35 U.S.C. §119 to Japanese Patent Application No. JP2007-324155 filed on Dec. 17, 2007, the entire content of which is hereby incorporated by reference.

RELATED APPLICATIONS

Related subject matter is disclosed the following co-pending, commonly assigned patent applications;

application Ser. No. 12/188,726, titled "A Piezoelectric Oscillator and Case Having An Integral Electrical Terminal" filed Aug. 8, 2008; and application Ser. No. 12/329,528, titled "Electronic Device Having A Piezoelectric Vibrating Reed With A Discontinuous Electrode Film", filed Dec. 5, 2008.

BACKGROUND OF THE INVENTION

1. Field of the Invention

The present invention relates to a piezoelectric vibrating reed made of a piezoelectric material, such as quartz and lithium tantalate, a piezoelectric vibrator having the piezoelectric vibrating reed, and an oscillator, an electronic device, and a wave clock each having the piezoelectric vibrator, as well as a manufacturing method of the piezoelectric vibrating reed.

2. Background Art

Recently, a piezoelectric vibrator utilizing quartz or the like is used in a cell-phone and a personal digital assistance as the time source, the timing source of a control signal, a reference signal source, and so forth. The piezoelectric vibrator of this type is proposed in a variety of forms, and a cylinder package type piezoelectric vibrator in which a piezoelectric vibrating reed is encapsulated in a cylindrical case is one example. The piezoelectric vibrator of this type is described, for example, in JP-A-8-298425, JP-A-2001-144581, and JP-A-2001-217677.

As is shown in FIG. 29, a piezoelectric vibrator 200 of this type includes a tuning-fork piezoelectric vibrating reed 201, a case 202 in the shape of a bottomed cylinder to accommodate the piezoelectric vibrating reed 201 inside, and an airtight terminal 203 to hermetically seal the piezoelectric vibrating reed 201 inside the case 202.

As are shown in FIG. 30 and FIG. 31, the piezoelectric vibrating reed 201 is a tuning-fork vibrating reed made of a piezoelectric material of various types and has a pair of vibrating arms 211 disposed parallel to each other and fixed integrally to a base portion 210 on the base end side, a pair of excitation electrodes 212 and 213 formed on the outer surfaces of a pair of the vibrating arms 211 to vibrate a pair of the vibrating arms 211, and a pair of mount electrodes 215 and 216 electrically connected to a pair of the excitation electrodes 212 and 213, respectively, via extraction electrodes 214.

FIG. 30 is a view of the piezoelectric vibrating reed 210 when viewed from above and FIG. 31 is a view of the piezoelectric vibrating reed 210 when viewed from below.

It is configured in such a manner that a voltage is applied to the excitation electrodes 212 and 213 via the mount electrodes 215 and 216, respectively. When a voltage is applied, the excitation electrodes 212 and 213 vibrate a pair of the vibrating arms 211 at a specific resonance in a direction to come close to or move apart from each other. It should be noted that a pair of the mount electrodes 215 and 216 is formed on each of the both surfaces of the piezoelectric vibrating reed 201.

As is shown in FIG. 29, the airtight terminal 203 is formed of an annular stem 220 made of a metal material, two lead terminals 221 provided to penetrate through the stem 220, and a filling material 223 not only to integrally fix the lead terminals 221 and the stem 220 in an insulating state but also to hermetically seal the interior of the case 202.

Regarding the two lead terminals 221, portions protruding inside the case 202 and connected to a pair of the mount electrodes 215 and 216 serve as inner leads 221a and portions protruding to the outside of the case 202 serve as outer leads 221b. The outer leads 221b function as external connection terminals.

The case 202 is press-fit to the outer circumference of the stem 220 and is thereby fit fixedly. Press-fitting of the case 202 is carried out under vacuum atmosphere. Accordingly, a space surrounding the piezoelectric vibrating reed 201 inside the case 202 is hermetically sealed in a state maintained under vacuum.

According to the piezoelectric vibrator 200 configured as above, when a predetermined voltage is applied to the respective outer leads 221b of the two lead terminals 221 as a drive voltage, a current flows into the piezoelectric vibrating reed 201 from the inner leads 221a via the mount electrodes 215 and 216. The piezoelectric vibrating reed 201 thus oscillates at a specific frequency.

The piezoelectric vibrator 200 in the related art, however, has problems as follows.

As is represented by a cell-phone, various electronic devices enclosing the piezoelectric vibrator are becoming smaller in recent years. Accordingly, there is a need for the piezoelectric vibrator to further reduce the size. To date, there is a type having a case diameter D as small as 1.2 mm. However, in order to satisfy the need for a size reduction as above, studies are being conducted for an ultra-compact type having a case diameter D as small as 1.0 mm or further smaller than 1.0 mm. In order to address such a size reduction, a type having a single lead terminal instead of the one having two lead terminals is now proposed.

With a type using two lead terminals as before, even when the diameter of the lead terminals is reduced, the rigidity deteriorates extremely and the lead terminals readily undergo deformation. The lead terminals therefore may no longer be able to ensure electrical independence. To overcome such an inconvenience, a type having a single lead terminal is proposed.

In a case where a single lead terminal is used, the base portion of the piezoelectric vibrating reed is mounted on the lead terminal and the lead terminal is electrically connected to either one mount electrode in a pair of the mount electrodes. In addition, the other mount electrode and the stem of the airtight terminal are directly connected using a wire rod, such as a wire. This configuration makes it possible to electrically connect the other mount electrode and the stem. In other words, in a case where a single lead terminal is used, it becomes possible to vibrate the piezoelectric vibrating reed by applying a predetermined drive voltage to the lead terminal and the stem.

Incidentally, the piezoelectric vibrating reed in the related art has a disadvantage that the R1 characteristic (series resonance resistance value) undesirably becomes higher when configured to correspond to the single lead as described above.

To describe this inconvenience more specifically, as are shown in FIG. 30 and FIG. 31, the excitation electrodes 212 and 213, the extraction electrodes 214, and the mount electrodes 215 and 216 are formed on the both surfaces of the piezoelectric vibrating reed 201. In particular, the mount electrodes 215 and 216 having different polarities are formed on each of the both surfaces of the base portion 210. In other words, the base portion 210 is of a sandwich structure in which it is sandwiched by the mount electrodes 215 and 216 from above and below. This configuration brings the mount electrodes 215 and 216 in a state where they are disposed oppositely with the base portion 210 in between. Accordingly, there arises a problem that the mount electrodes 215 and 216 function as a capacitor and an electrostatic capacity is accumulated between the mount electrodes 215 and 216. This problem gives rise to an inconvenience that the R1 characteristic of the piezoelectric vibrating reed 201 in itself undesirably becomes higher. The vibration performance of the piezoelectric vibrating reed 201 therefore becomes poor and it is difficult to achieve a high-performance piezoelectric vibrator 200. In addition, when the R1 characteristic becomes higher, so does the effective resistance value Re of the piezoelectric vibrating reed 201. It is therefore difficult to make the piezoelectric vibrating reed 201 operate on low power.

The effective resistance value Re is expressed by an equation:

$$Re = [R1(1+(C_O/C_L)^2]$$

where $C_O$ is the original electrostatic capacitance value of the piezoelectric vibrating reed 201 and $C_L$ is a constant.

SUMMARY OF THE INVENTION

The invention was devised in view of the foregoing and has an object to provide a piezoelectric vibrating reed not only capable of saving power but also capable of achieving higher performance by lowering the R1 characteristic and thereby enhancing the vibration characteristic, and a manufacturing method of a piezoelectric vibrating reed for manufacturing the piezoelectric vibrating reed as above.

The invention has another object to provide a piezoelectric vibrator having the piezoelectric vibrating reed as well as an oscillator, an electronic device, and a wave clock each having the piezoelectric vibrator.

In order to achieve the above and other objects, the invention provides the following configurations.

A piezoelectric vibrating reed according to one aspect of the invention includes a piezoelectric plate made of a piezoelectric material, a pair of excitation electrodes formed on outer surfaces of the piezoelectric plate and configured to vibrate the piezoelectric plate when a predetermined voltage is applied thereon, and a pair of mount electrodes electrically connected to the pair of excitation electrodes, respectively, wherein one mount electrode in the pair of mount electrodes is formed on one surface of the piezoelectric plate and the other mount electrode is formed on the other surface of the piezoelectric plate in a state not to oppose the one mount electrode with the piezoelectric plate in between.

Also, a method of manufacturing a piezoelectric vibrating reed according to another aspect of the invention is a method for manufacturing a plurality of piezoelectric vibrating reeds at a time using a wafer made of a piezoelectric material, and it includes an outer shape forming step of patterning outer shapes of a plurality of piezoelectric plates on the wafer by etching the wafer using a photolithographic technique, an electrode forming step of patterning an electrode film on outer surfaces of a plurality of the piezoelectric plates to form a pair of excitation electrodes configured to vibrate a corresponding piezoelectric plate when a predetermined voltage is applied thereon and a pair of mount electrodes electrically connected to the pair of excitation electrodes, respectively, and a cutting step of separating a plurality of the piezoelectric plates off from the wafer in the form of small pieces, wherein, in the electrode forming step, one mount electrode in the pair of mount electrodes is formed on one surface of the piezoelectric plate and the other mount electrode is formed on the other surface of the piezoelectric plate in a state not to oppose the one mount electrode with the piezoelectric plate in between.

According to the piezoelectric vibrating reed and the manufacturing method of the piezoelectric vibrating reed of the invention, the outer shape forming step of patterning the outer shapes of a plurality of the piezoelectric plates on the wafer is performed by etching the wafer made of a piezoelectric material, such as quartz, using the photolithographic technique. Subsequently, the electrode forming step of forming a pair of excitation electrodes and a pair of mount electrodes is performed by patterning the electrode film on the outer surfaces of a plurality of the piezoelectric plates. The cutting step of separating a plurality of the piezoelectric plates off from the wafer in the form of small pieces is then performed. It thus becomes possible to manufacture a plurality of piezoelectric vibrating reeds, in each of which a pair of the excitation electrodes and a pair of the mount electrodes are formed on the outer surfaces of the piezoelectric plate, from a single wafer at a time.

In particular, in the electrode forming step, the electrode film is patterned in such a manner that one mount electrode is formed on one surface of the piezoelectric plate and the other mount electrode is formed on the other surface. More specifically, both the mount electrodes having different polarities are not formed simultaneously on one surface, and instead, one mount electrode alone is formed on one surface and the other mount electrode having a different polarity alone is formed on the other surface. Moreover, the other mount electrode is formed in a state not to oppose the one mount electrode with the piezoelectric plate in between. In short, one mount electrode and the other mount electrode are formed so as not to overlap when the piezoelectric vibrating reed is viewed in a plane.

When configured in this manner, the piezoelectric vibrating reed is not formed in the sandwich structure in which the base portion is sandwiched by a pair of the mount electrodes from the both surface sides as in the related art. Accordingly, when a predetermined voltage is applied to a pair of the mount electrodes, a pair of the mount electrodes will not function as a capacitor as in the related art, and there is no risk that an electrostatic capacitance is accumulated between a pair of the mount electrodes. It thus becomes possible to prevent the R1 characteristic of the piezoelectric vibrating reed in itself from becoming higher, and the R1 characteristic can be maintained at a low value as designed. Hence, the R1 characteristic can be maintained at as low a value as possible, and the piezoelectric vibrating reed capable achieving higher performance by enhancing the vibrating characteristic can be manufactured. Also, because the R1 characteristic can be maintained low, the effective resistance value Re of the piezoelectric vibrating reed can be lowered, too. The power can be therefore saved.

Also, in the piezoelectric vibrating reed of the invention described above, the piezoelectric plate includes a pair of vibrating arms disposed parallel to each other and a base portion to which the pair of vibrating arms is fixed integrally on a base end side, the pair of excitation electrodes is formed on outer surfaces of the pair of vibrating arms, and the one mount electrode is formed on one surface of the base portion and the other mount electrode is formed on the other surface of the base portion.

Also, in the method of manufacturing a piezoelectric vibrating reed of the invention described above, in the outer shape forming step, the outer shapes of the piezoelectric plates are patterned in such a manner that each has a pair of vibrating arms disposed parallel to each other and a base portion to which the pair of vibrating arms is fixed integrally on a base end side, and in the electrode forming step, the electrode film is patterned in such a manner that the pair of excitation electrodes is formed on outer surfaces of the pair of vibrating arms and that the one mount electrode is formed on one surface of the base portion and the other mount electrode is formed on the other surface of the base portion.

According to the piezoelectric vibrating reed and the manufacturing method of the piezoelectric vibrating reed of the invention, in the outer shape forming step, the outer shapes of the piezoelectric plates are patterned in such a manner that each has a pair of vibrating arms integrally fixed to the base portion on the base end side. Also, in the electrode forming step, the electrode film is patterned in such a manner that the pair of excitation electrodes is formed on outer surfaces of the pair of vibrating arms, and the electrode film is also patterned in such a manner that one mount electrode is formed on one surface of the base portion and the other mount electrode is formed on the other surface of the base portion. It thus becomes possible to manufacture a generally used tuning-fork piezoelectric vibrating reed. Moreover, because the pair of mount electrodes is formed so as not to oppose each other with the base portion in between, it becomes possible to obtain a high-performance tuning-fork piezoelectric vibrating reed with the lower R1 characteristic and hence the enhanced vibration characteristic.

Also, in the piezoelectric vibrating reed of the invention described above, groove portions are provided to the pair of vibrating arms on both surfaces thereof.

Also, in the manufacturing method of the piezoelectric vibrating reed of the invention described above, in the outer shape forming step, groove portions are provided to the pair of vibrating arms on both surfaces thereof.

According to the piezoelectric vibrating reed and the manufacturing method of the piezoelectric vibrating reed of the invention, because the groove portions are provided to the pair of vibrating arms on both surfaces, it is possible to increase the field efficiency between the pair of excitation electrodes when a predetermined voltage is applied to the pair of excitation electrodes. Accordingly, a vibration loss can be suppressed further, which can further enhance the vibration characteristic.

In short, because a CI (crystal impedance) value can be lowered further, the piezoelectric vibrating reed can achieve further higher performance.

Also, a piezoelectric vibrator according to still another aspect of the invention includes the piezoelectric vibrating reed of the invention described above.

Because the piezoelectric vibrator of the invention includes the piezoelectric vibrating reed described above, the piezoelectric vibrator itself becomes able to save power and achieve higher performance.

Also, the piezoelectric vibrator of the invention described above further includes a conductive case configured to accommodate the piezoelectric vibrating reed inside, an airtight terminal having a conductive stem formed in an annular shape to be press-fit and fixed in the case, a single lead terminal disposed to penetrate through the stem and serving as an inner lead to be electrically connected to the one mount electrode on one end side with the stem in between and serving as an outer lead to be electrically connected to an outside on the other end side, and a filling material fixing the lead terminal and the stem, and a wire rod configured to electrically connect the stem and the other mount electrode inside the case.

According to the piezoelectric vibrator of the invention, the piezoelectric vibrating reed is accommodated inside the case that is hermetically sealed by the airtight terminal. In this instance, the piezoelectric vibrating reed is supported on the lead terminal in a state where one mount electrode is electrically connected to the inner lead. Meanwhile, the other mount electrode is electrically connected to the conductive stem via the wire rod. Because the stem is press-fit and fixed in the conductive case, the case and the other mount electrode are brought into an electrically connected state via the stem and the wire rod. Accordingly, a voltage can be applied to the pair of mount electrodes by applying a predetermined voltage to the outer lead of the lead terminal and the case, which allows the piezoelectric vibrating reed to vibrate.

In particular, because the piezoelectric vibrator can be of a cylinder package type in which the piezoelectric vibrating reed is hermetically sealed inside the case, it is possible to vibrate the piezoelectric vibrating reed without being affected by dust or the like. The piezoelectric vibrating reed can therefore be vibrated at a higher degree of accuracy. Moreover, because only the single lead terminal is used, the piezoelectric vibrator can be an ultra-compact piezoelectric vibrator.

Also, the piezoelectric vibrator of the invention further includes a case configured to accommodate the piezoelectric vibrating reed inside, and an airtight terminal configured to hermetically seal an interior of the case and having a stem formed in an annular shape to be press-fit and fixed in the case, two lead terminals disposed to penetrate through the stem and serving as inner leads to be electrically connected, respectively, to the pair of mount electrodes on one end side with the stem in between and serving as outer leads to be electrically connected to an outside on the other end side, and a filling material fixing the lead terminal and the stem.

According to the piezoelectric vibrator of the invention, the piezoelectric vibrating reed is accommodated inside the case that is hermetically sealed by the airtight terminal. In this instance, the piezoelectric vibrating reed is supported by the lead terminals in a state where the pair of mount electrodes is electrically connected to the inner leads of the two lead terminals, respectively. Accordingly, a voltage can be applied to the pair of mount electrodes by applying a predetermined voltage to the outer leads of the two lead terminals, which allows the piezoelectric vibrating reed to vibrate.

In particular, because the piezoelectric vibrator can be of a cylinder package type in which the piezoelectric vibrating reed is hermetically sealed inside the case, it is possible to vibrate the piezoelectric vibrating reed without being affected by dust or the like. The piezoelectric vibrating reed can be therefore vibrated at a higher degree of accuracy.

Also, an oscillator according to still another aspect of the invention includes the piezoelectric vibrator of the invention described above, and the piezoelectric vibrator is electrically connected to an integrated circuit as a resonator.

Also, an electronic device according to still another aspect of the invention includes the piezoelectric vibrator of the invention described above, and the piezoelectric vibrator is electrically connected to a clock portion.

Also, a wave clock according to still another aspect of the invention includes the piezoelectric vibrator of the invention described above, and the piezoelectric vibrator is electrically connected to a filter portion.

According to the oscillator, the electronic device, and the wave clock of the invention, because each includes the piezoelectric vibrator described above, it is possible to save power and achieve higher performance as with the piezoelectric vibrator.

DESCRIPTION OF THE PREFERRED EMBODIMENTS

First Embodiment

Figure 1:
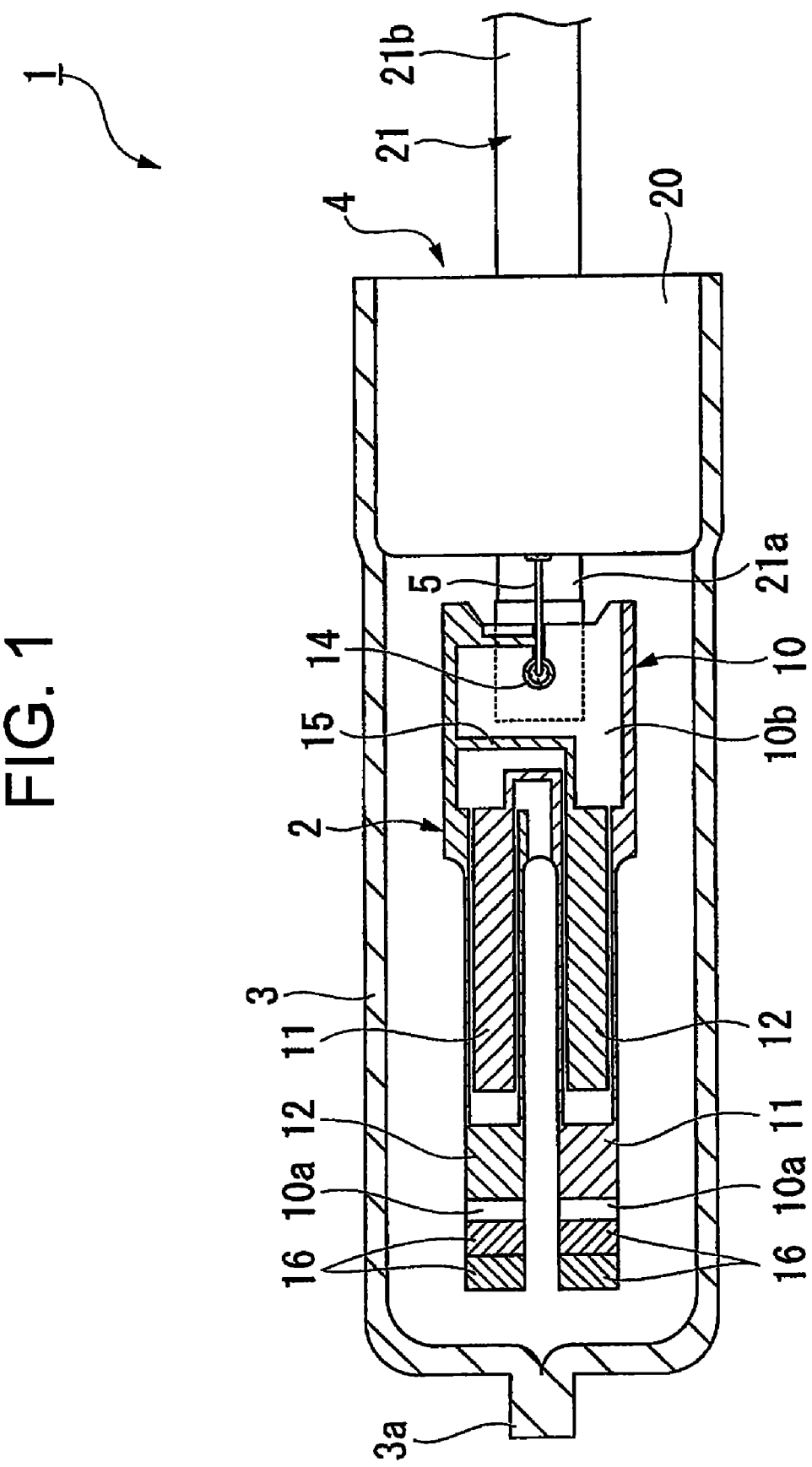
FIG. 1 is a view showing the inside of the case of a piezoelectric vibrator according to a first embodiment of the invention when a piezoelectric vibrating reed is viewed in a plane.

Hereinafter, a first embodiment of the invention will be described with reference to FIG. 1 through FIG. 12. In this embodiment, descriptions will be given to a piezoelectric vibrator of a cylinder package type having a single lead terminal by way of example.

As are shown in FIG. 1 through FIG. 12, a piezoelectric vibrator 1 of this embodiment includes a piezoelectric vibrating reed 2, a case 3 that accommodates the piezoelectric vibrating reed 2 inside, an airtight terminal 4 that hermitically seals the piezoelectric vibrator 1 inside the case 3, and a wire (wire rod) 5 that electrically connects a stem 20 and the other mount electrode 14 described below inside the case 3.

Figure 4:
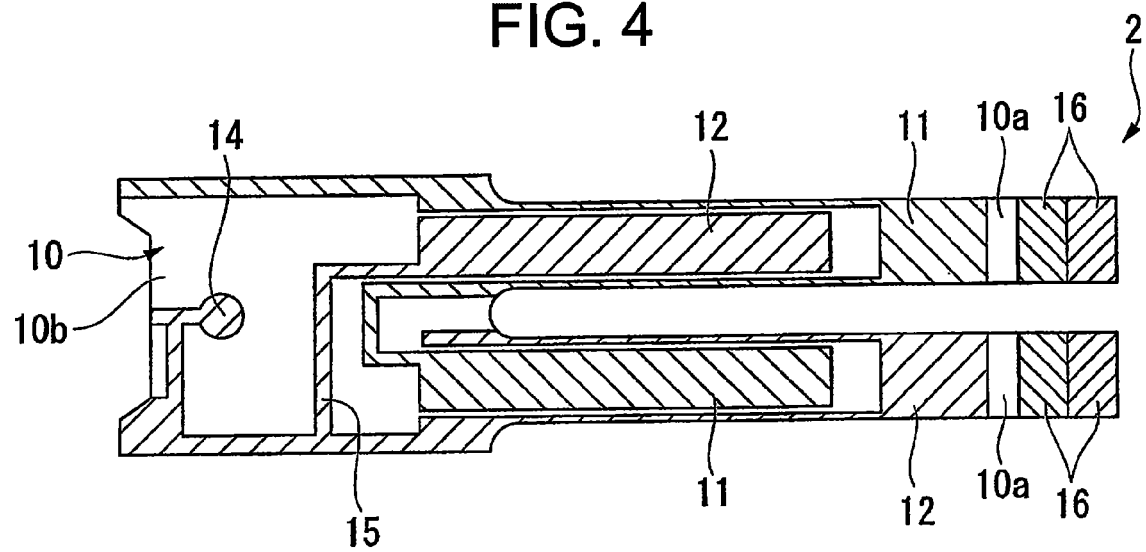
FIG. 4 is a view of the piezoelectric vibrating reed shown in FIG. 1 when viewed from above.
Figure 5:
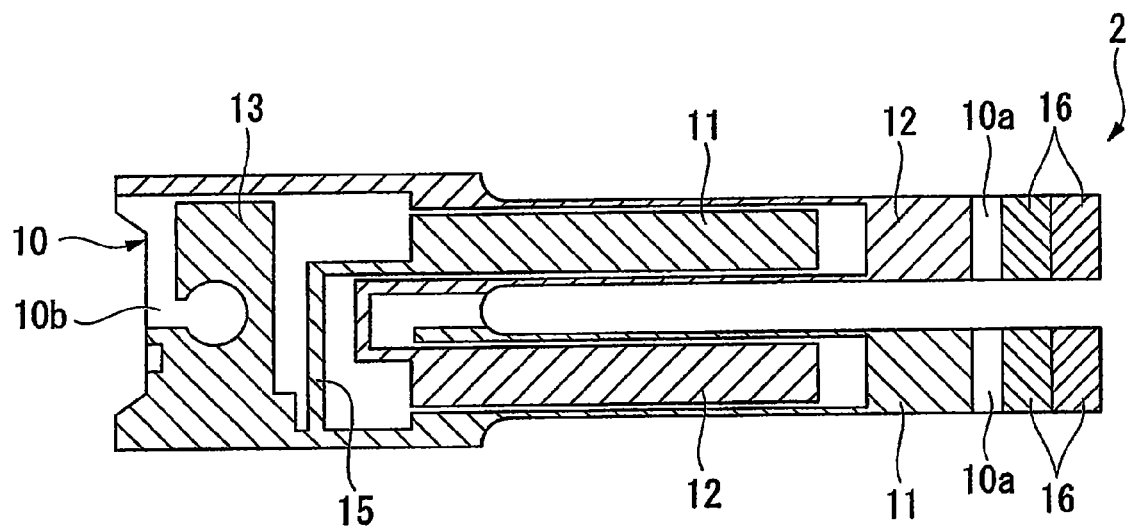
FIG. 5 is a view of the piezoelectric vibrating reed shown in FIG. 1 when viewed from below.

As are shown in FIG. 4 and FIG. 5, the piezoelectric vibrating reed 2 includes a piezoelectric plate 10 made of a piezoelectric material, such as quartz, lithium tantalate, and lithium niobate, a pair of excitation electrodes 11 and 12 formed on the outer surfaces of the piezoelectric plate 10 to vibrate the piezoelectric plate 10 when a predetermined voltage is applied thereon, and a pair of mount electrodes 13 and 14 electrically connected to a pair of the excitation electrodes 11 and 12, respectively. FIG. 4 is a view of the piezoelectric vibrating reed 2 when viewed from above and FIG. 5 is a view of the piezoelectric vibrating reed 2 when viewed from below.

Of a pair of the mount electrodes 13 and 14, one mount electrode 13 is formed on the under surface (one surface) of the piezoelectric plate 10 and the other mount electrode 14 is formed on the top surface (the other surface) of the piezoelectric plate 10 in a state not to oppose one mount electrode 13 with the piezoelectric plate 10 in between.

The piezoelectric vibrating reed 2 will now be described more in detail. The piezoelectric vibrating reed 2 of this embodiment is a tuning-fork vibrating reed in which the piezoelectric plate 10 is formed of a pair of vibrating arms 10a disposed parallel to each other and a base portion 10b to which a pair of the vibrating arms 10a is integrally fixed on the base end side.

A pair of the excitation electrodes 11 and 12 is formed on the outer surfaces of a pair of the vibrating arms 10a, and they are electrodes that vibrate a pair of the vibrating arms 10a in a direction to come close to or move apart from each other when a predetermined voltage is applied thereon. Also, a pair of the mount electrodes 13 and 14 is electrically connected to a pair of the excitation electrodes 11 and 12, respectively, via extraction electrodes 15.

Herein, one mount electrode 13 is formed on the under surface of the base portion 10b and the other mount electrode 14 is formed on the top surface of the base portion 10b in a state not to oppose one mount electrode 13.

Figure 6:
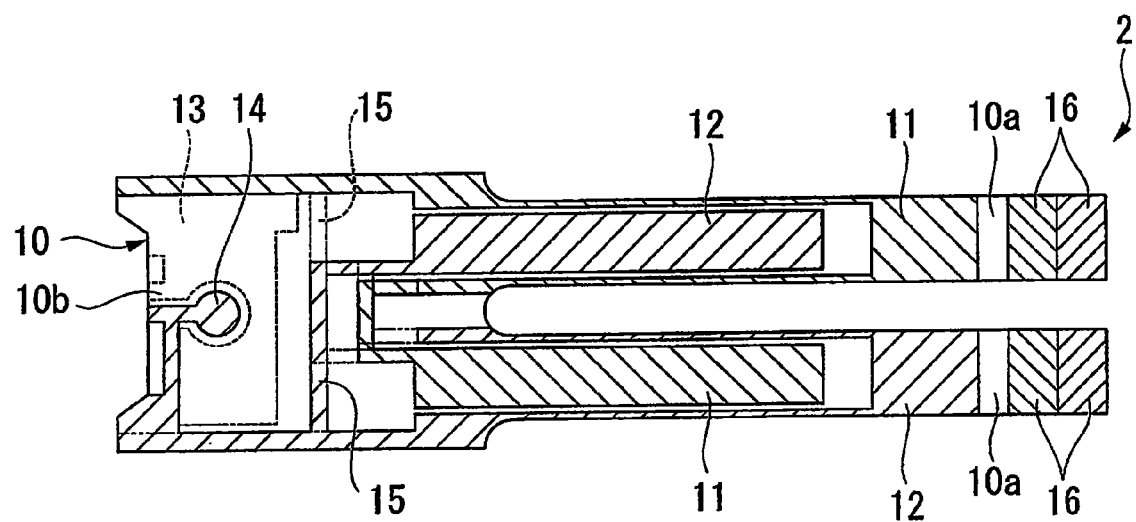
FIG. 6 is a view of the piezoelectric vibrating reed shown in FIG. 1 when viewed from above to describe the positional relation of a pair of mount electrodes.

Accordingly, as is shown in FIG. 6, when the piezoelectric vibrating reed 2 is viewed in a plane from above, one mount electrode 13 and the other mount electrode 14 do not overlap.

As are shown in FIG. 4 and FIG. 5, a pair of the vibrating arms 10a is coated with a weight metal film 16 at the tip ends for adjusting their own vibration states (tuning the frequency) in such a manner so as to vibrate within a specific frequency range. By tuning the frequency with the use of the weight metal film 16, the frequency of a pair of the vibrating arms 10a can be set to fall within a range of the nominal frequency of the device.

Figure 2:
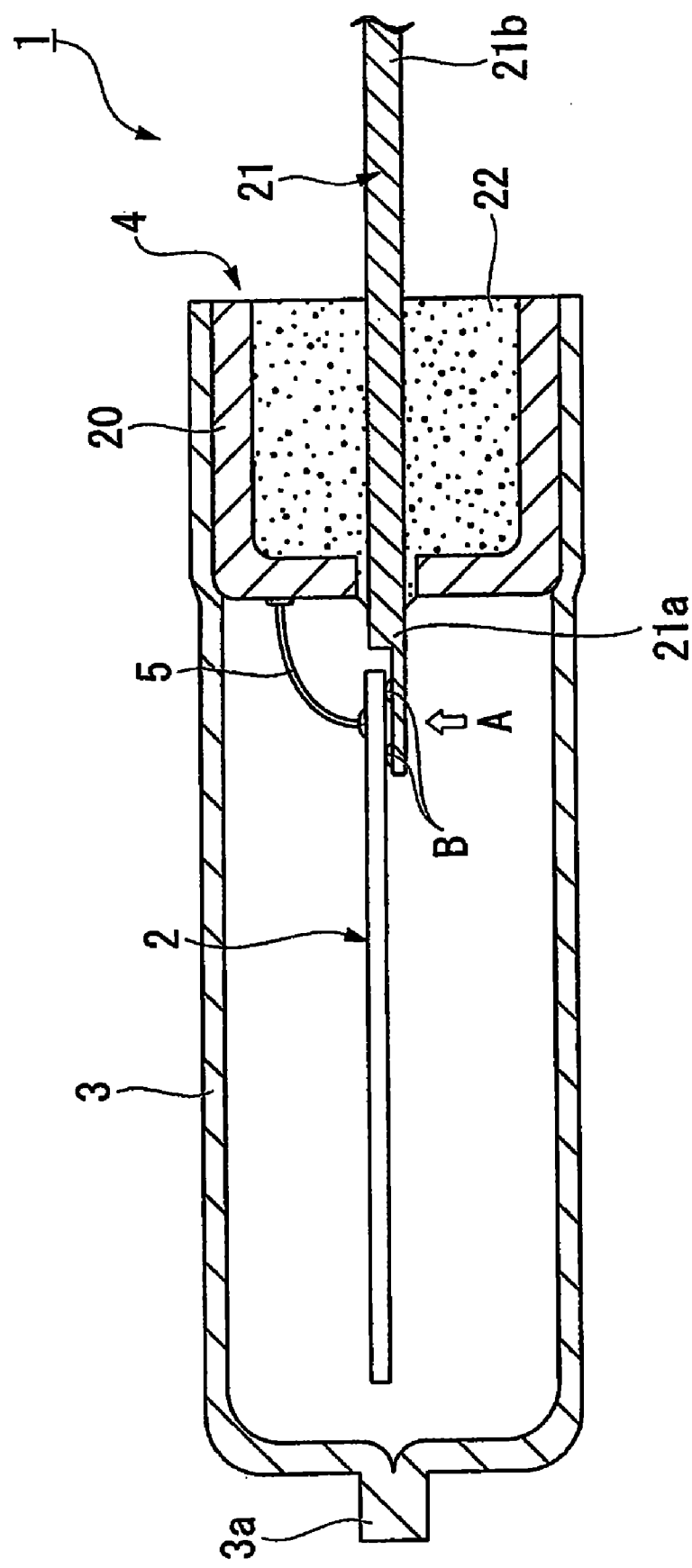
FIG. 2 is a view of the piezoelectric vibrator shown in FIG. 1 when viewed from the side.
Figure 3:
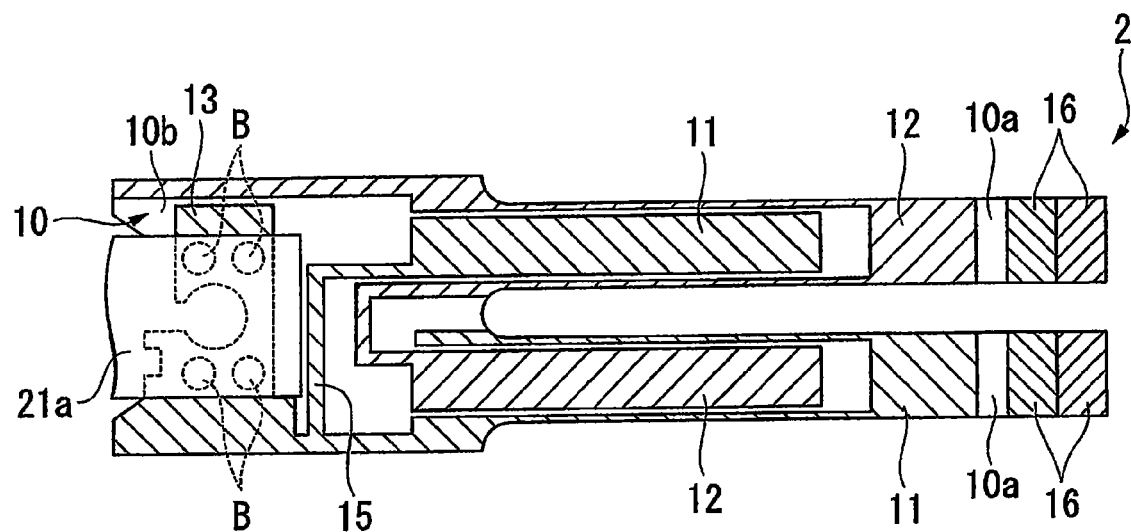
FIG. 3 is a view of the piezoelectric vibrating reed shown in FIG. 1 when viewed from a direction indicated by an arrow A.

As are shown in FIG. 1 through FIG. 3, the piezoelectric vibrating reed 2 configured as above is mounted on an inner lead 21a of the lead terminal 21 that forms the airtight terminal 4 while it is accommodated in the case 3.

The case 3 is made of a conductive material in the shape of a bottomed cylinder. It is press-fit to the outer circumference of the stem 20 of the airtight terminal 4 described below and is thereby fit fixedly. Herein, the case 3 and the stem 20 are in an electrically connected state. Press-fitting of the case 3 is carried out under vacuum and a space surrounding the piezoelectric vibrating reed 2 inside the case 3 is in a state maintained under vacuum. In addition, the case 3 of this embodiment is draw-molded and has a protrusion 3a protruding outward from the end face. The protrusion 3a is formed, for example, to have a circular cross section.

The airtight terminal 4 is to hermetically seal the interior of the case 3 and has the stem 20 to be press-fit fixedly in the case 3, a single lead terminal 21 disposed to penetrate through the stem 20 and serving as an inner lead 21a to be electrically connected to one mount electrode 13 of the piezoelectric vibrating reed 2 on one end side with the stem 20 in between and serving as an outer lead 21b to be electrically connected to the outside on the other end side, and a filling material 22 to fix the lead terminal 21 and the stem 20.

The stem 20 is made of a metal material (for example, low-carbon steel (Fe), iron-nickel alloy (Fe—Ni), and iron-nickel-cobalt alloy (Fe—Ni—Co)) in an annular shape. The filling material 22 is made, for example, of borosilicate glass. It should be noted that the outer circumference of the stem 20 is coated with plating (metal film) made of the same material as the lead terminal 21.

The lead terminal 21 is made, for example, of a conductive material, which is the same material as the stem 20, in the shape of a plate (for example, the thickness of about 0.1 mm). A portion protruding inside the case 3 serves as the inner lead 21a and a portion protruding to the outside of the case 3 serves as the outer lead 21b. The inner lead 21a is formed to have a step-wise tip end. The piezoelectric vibrating reed 2 is mechanically mounted by bumps B, such as gold, while the base portion 10b is placed on this stepped portion. This configuration brings one mount electrode 13 formed on the under surface of the base portion 10b and the inner lead 21a in an electrically connected state. This embodiment describes a case where the piezoelectric vibrating reed 2 is mounted by four bumps B by way of example.

Meanwhile, the wire 5 described above is connected between the other mount electrode 14 formed on the top surface of the base portion 10b and the stem 20. This configuration brings the other mount electrode 14, the stem 20, and the case 3 in an electrically interconnected state.

As a material of the plating on the stem 20 and the lead terminal 21 forming the piezoelectric vibrator 1 of this embodiment, heat-resistant solder plating, tin-copper alloy, gold-tin alloy, and so forth are used. Also, by cold-welding the stem 20 to the case 3 under vacuum by interposing the plating on the outer circumference of the stem 20, the interior of the case 3 can be hermetically sealed under vacuum. Also, the excitation electrodes 11 and 12, the extraction electrodes 15, and the mount electrodes 13 and 14 are made of a laminated film of chromium (Cr) and gold (Au), which is formed by depositing a chromium film having good adhesion to quartz as a base and then depositing a thin film of gold on the surface of the base. It should be appreciated, however, that the invention is not limited to this example, and for instance, a thin film of gold may be further laminated on the surface of a laminated film of chromium and nichrome (NiCr).

Figure 7:
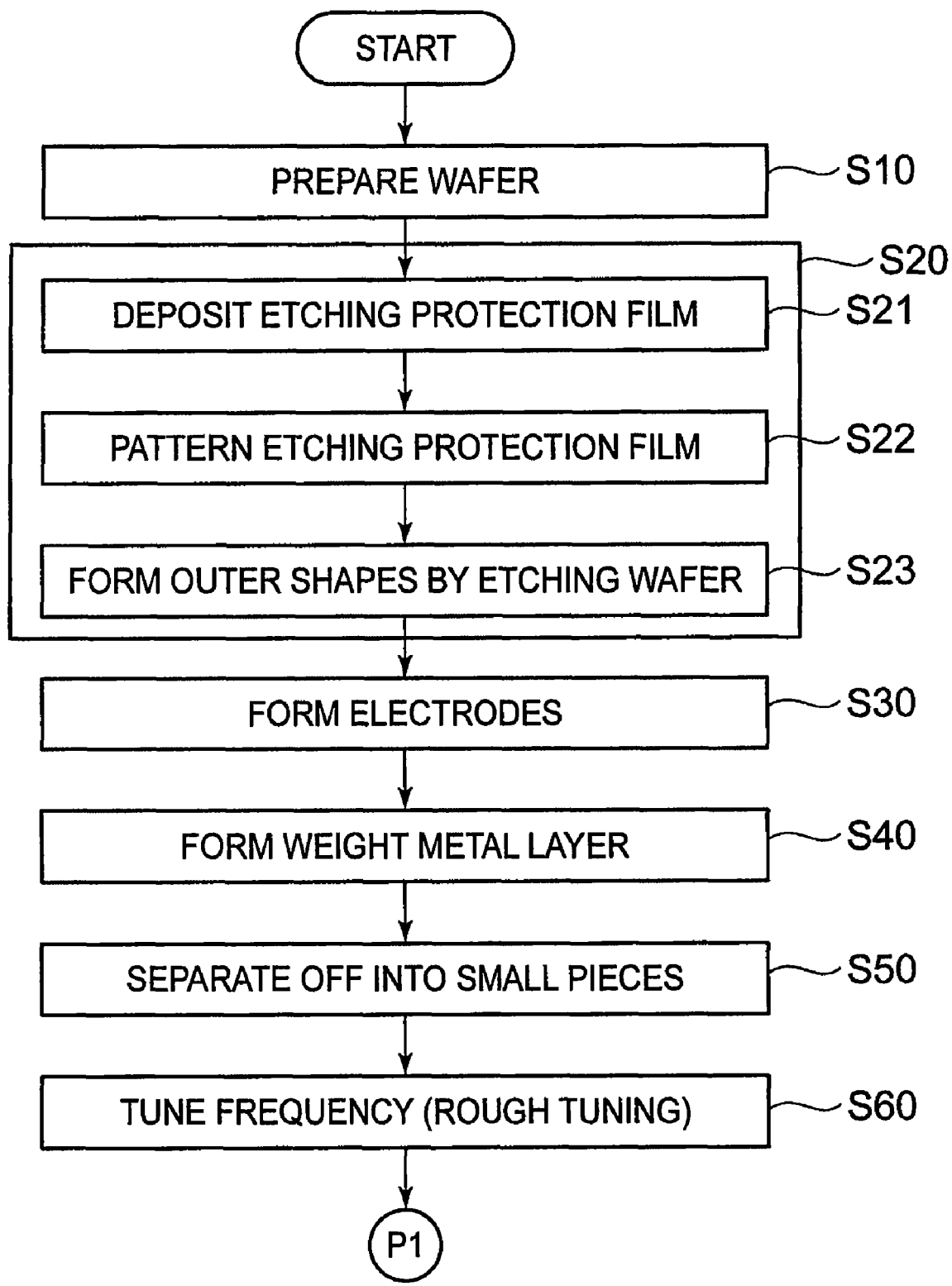
FIG. 7 is a flowchart when the piezoelectric vibrator shown in FIG. 1 is manufactured.
Figure 8:
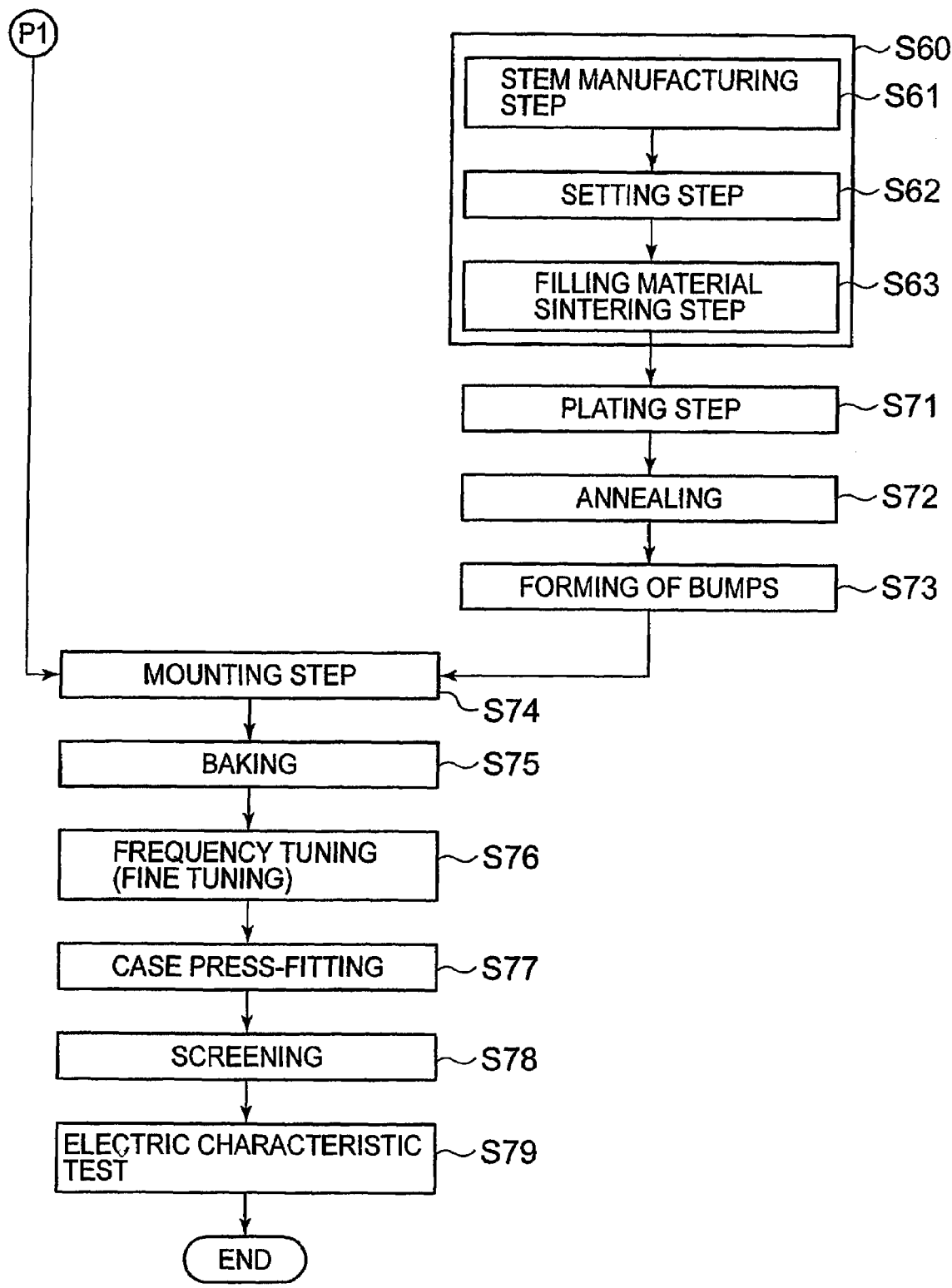
FIG. 8 is a flowchart continued from the flowchart in FIG. 7.

A method of manufacturing the piezoelectric vibrating reed 2 and the piezoelectric vibrator 1 described above will now be described with reference to the flowcharts shown in FIG. 7 and FIG. 8.

Firstly, the step of manufacturing a plurality of the piezoelectric vibrating reeds 2 at a time using a wafer S made of a piezoelectric material will be performed. In order to perform this step, a wafer S finished to a specific thickness at high accuracy after predetermined polishing is prepared first (S10). Subsequently, the outer shape forming step of patterning the outer shapes of a plurality of the piezoelectric plates 10 on the wafer S is performed by etching the wafer S using the photolithographic technique (S20). This step will be described more concretely.

Figure 9:
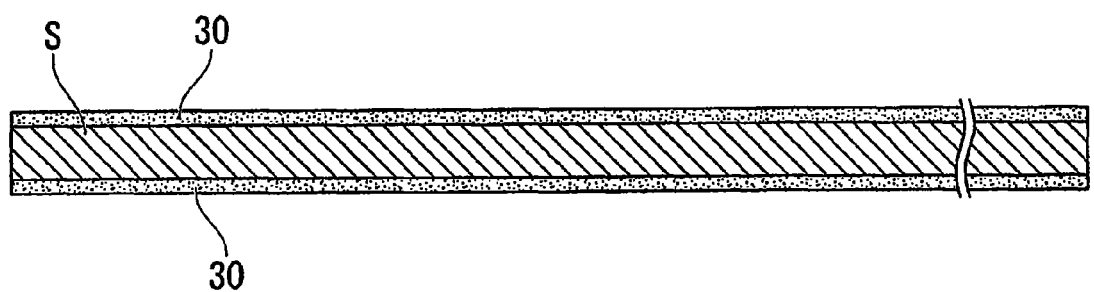
FIG. 9 is a view showing one step when the piezoelectric vibrator shown in FIG. 1 is manufactured in a state where an etching protection film is formed on the both surfaces of a wafer.
Figure 10:
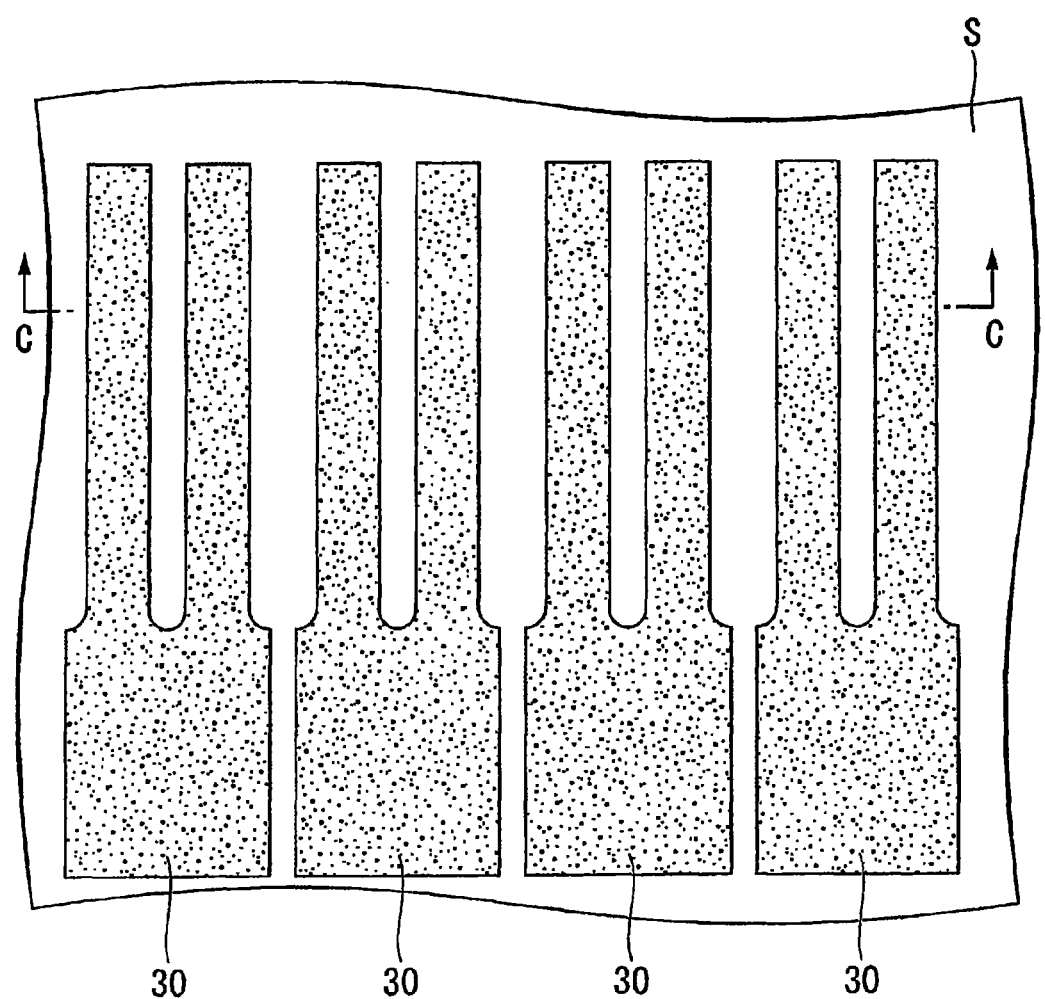
FIG. 10 is a view showing a state where the outer shapes of piezoelectric plates of the piezoelectric vibrating reed are patterned on the etching protection film from the state shown in FIG. 9.
Figure 11:
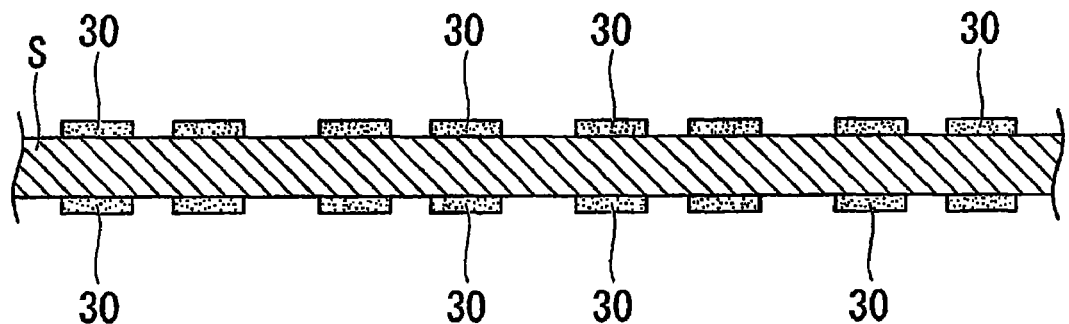
FIG. 11 is a cross section taken on line C-C of FIG. 10.
Figure 12:
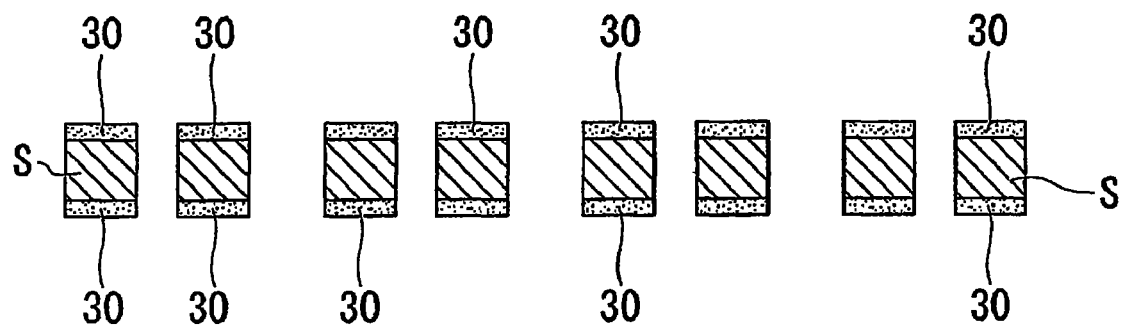
FIG. 12 is a view showing a state where the wafer is etched using the etching protection film as a mask from the state shown in FIG. 11.
Figure 13:
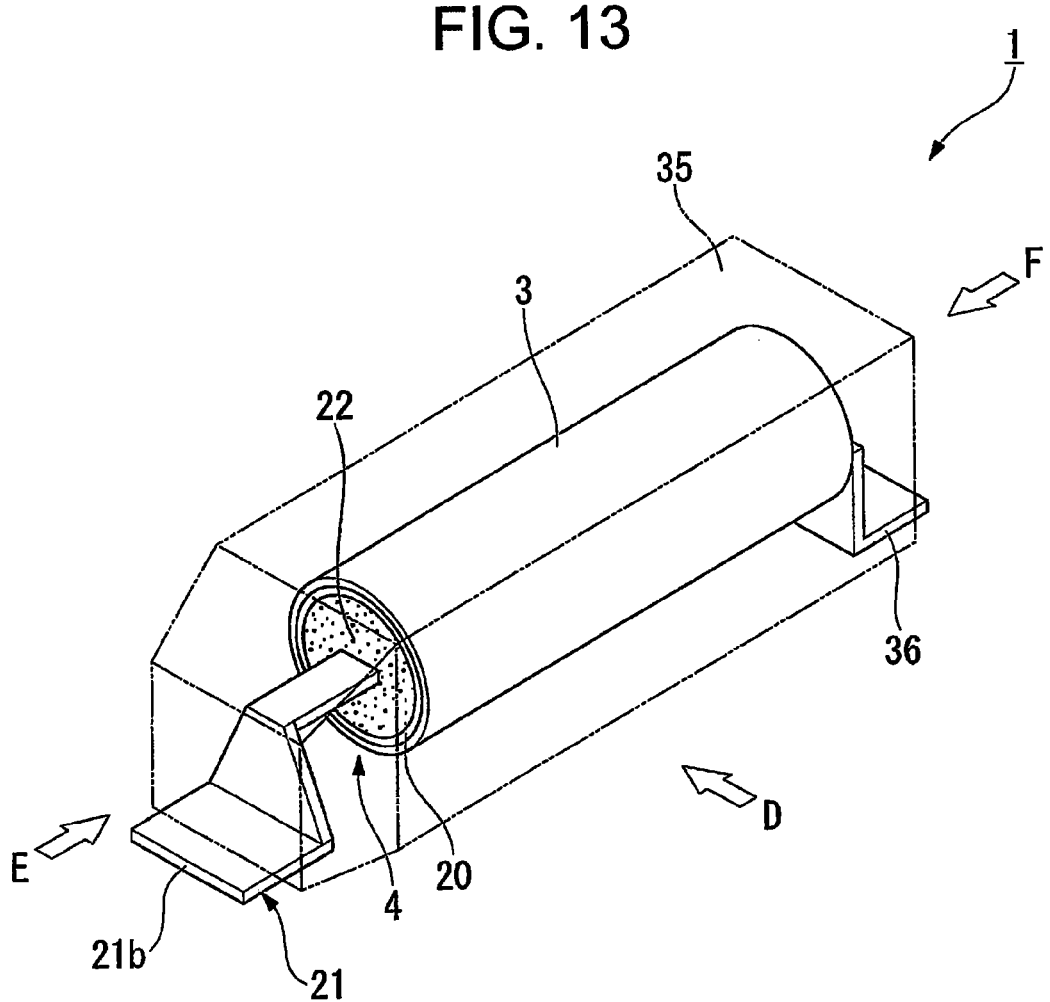
FIG. 13 is a perspective view of a surface-mounting type piezoelectric vibrator in which the periphery of the case is molded by a mold resin portion to show a modification of the piezoelectric vibrator of the invention.
Figure 14:
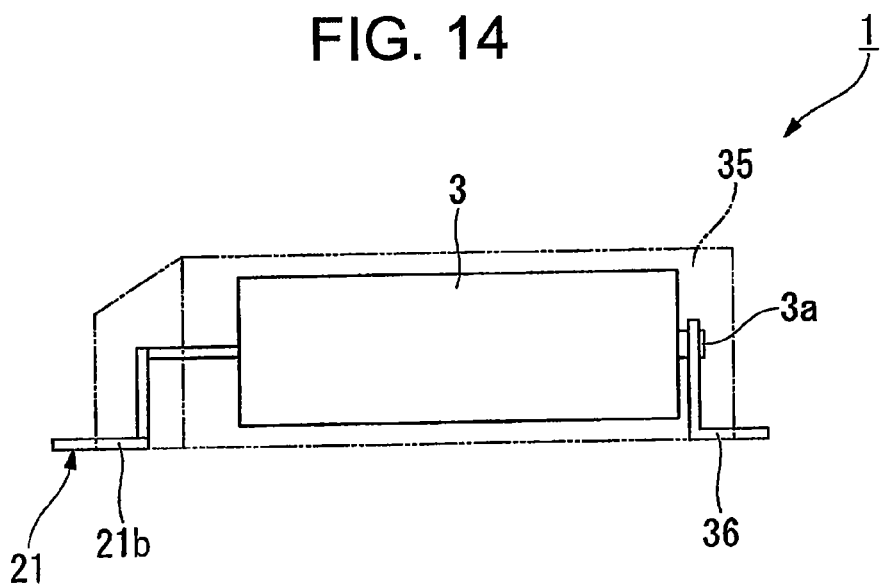
FIG. 14 is a view of the piezoelectric vibrator shown in FIG. 13 when viewed in a direction indicated by an arrow D.
Figure 15:
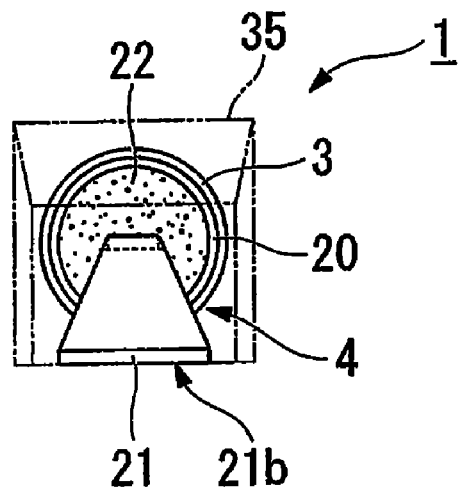
FIG. 15 is a view of the piezoelectric vibrator shown in FIG. 13 when viewed in a direction indicated by an arrow E.
Figure 16:
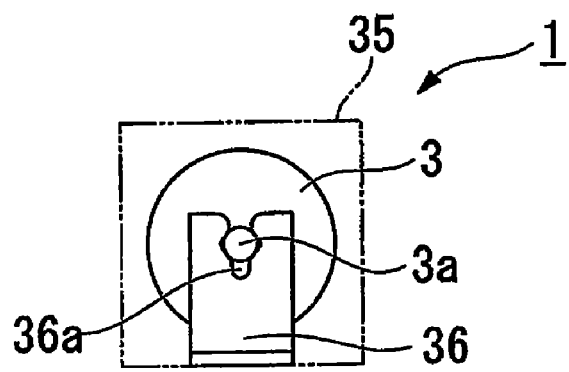
FIG. 16 is a view of the piezoelectric vibrator shown in FIG. 13 when viewed in a direction indicated by an arrow F.

Initially, as is shown in FIG. 9, an etching protection film 30 is deposited on the both surfaces of the wafer S (S21). As the etching protection film 30, for example, a film of chromium (Cr) having a thickness of about several □m is deposited. Subsequently, an unillustrated photoresist film is patterned on the etching protection film 30 using the photolithographic technique. In this instance, the photoresist film is patterned so as to surround the periphery of each piezoelectric plate 10 formed of a pair of the vibrating arms 10a and the base portion 10b. The etching is performed using the photoresist film as a mask, so that unmasked regions of the etching protection film 30 are selectively removed. The photoresist film is removed after the etching. Consequently, as are shown in FIG. 10 and FIG. 11, the etching protection film 30 is patterned to the shape described above (S22). In short, the etching protection film 30 can be patterned along the outer shape of the piezoelectric plate 10, that is, the outer shapes of a pair of the vibrating arms 10a and the base portion 10b. In this instance, as many outer shapes as a plurality of the piezoelectric plates 10 are patterned. FIG. 11 and FIG. 12 are views showing the cross sections taken on line C-C of FIG. 10.

Subsequently, the both surfaces of the wafer S are etched using the patterned etching protection film 30 as a mask (S23). Accordingly, as is shown in FIG. 12, the outer shape of the piezoelectric plate 10 can be formed by selectively removing regions unmasked by the etching protection film 30. The outer shape forming step ends when the etching protection film 30 used as the mask is removed. A plurality of the piezoelectric plates 10 remain in a state where they are connected to the wafer S via unillustrated connection portions until the cutting step is performed later.

Subsequently, the electrode forming step of forming the excitation electrodes 11 and 12, the extraction electrodes 15, and the mount electrodes 13 and 14 is performed by depositing an unillustrated electrode film on the outer surfaces of a plurality of piezoelectric plates 10 and patterning the electrode film (S30). The weight metal film 16 is formed at the same time in the same manner (S40).

In particular, when the electrode forming step is performed, the electrode film is patterned so that a pair of the excitation electrodes 11 and 12 is formed on the outer surfaces of a pair of the vibrating arms 10*a*, while the electrode film is patterned so that one mount electrode 13 is formed on the under surface of the base portion 10*b* and the other mount electrode 14 is formed on the top surface of the base portion 10*b*. More specifically, a pair of the mount electrodes 13 and 14 having different polarities is not formed on one surface of the base portion 10*b* at the same time, but one mount electrode 13 alone is formed on one surface (under surface) and the other mount electrode 14 having a different polarity alone is formed on the other surface (top surface).

In addition, the other mount electrode 14 is formed in a state not to oppose one mount electrode 13 with the base portion 10*b* in between. In short, one mount electrode 13 and the other mount electrode 14 are formed so as not to overlap when viewed in a plane.

Subsequently, the cutting step of cutting the connection portions connecting the wafer S and the piezoelectric plates 10 is performed so that a plurality of the piezoelectric plates 10 are separated off from the wafer S in the form of small pieces (S50). It thus becomes possible to manufacture a plurality of the piezoelectric vibrating reeds 2, in each of which the respective electrodes, that is, the excitation electrodes 11 and 12, the extraction electrodes 15, and the mount electrodes 13 and 14 are formed on the outer surfaces of the piezoelectric plate 10, from a single wafer S at a time. The manufacturing step of the piezoelectric vibrating reed 2 ends at this point.

The manufacturing step of the piezoelectric vibrator 1 is performed next. Before the piezoelectric vibrating reed 2 is mounted on the lead terminal 21, the resonance frequency is tuned roughly (S60). This rough tuning is performed by changing the weight with irradiation of a laser beam onto a rough tuning film of the weight metal film 16 for a part thereof to evaporate. Fine tuning to tune the resonance frequency at high accuracy is performed later, which will be described below.

In order to manufacture the piezoelectric vibrator 1, the airtight terminal manufacturing step of manufacturing the airtight terminal 4 is performed first (S70). To be more concrete, the stem 20 is manufactured first by the stem manufacturing step (S71). In other words, lancing is applied to a plate member having the conductivity, such as iron-nickel-cobalt alloy and iron-nickel alloy, and then deep drawing is repeated several times to form a bottomed tube member. The stem 20 is manufactured by providing an opening in the bottom surface of the tube member and separating the tube member off from the plate member by blanking punching.

Subsequently, the setting step of setting the lead terminal 21 and the filling material 22 inside the stem 20 is performed (S72). The manufactured stem 20 is first set to an unillustrated exclusive-use jig first, and thence the filling material 22 preliminarily sintered in the shape of a ring is set inside the stem 20 while the lead terminal 21 is set so as to penetrate through the filling material 22.

After the stem 20, the lead terminal 21, and the filling material 22 are combined in the setting step, the filling material 22 is sintered under temperature atmosphere at about 1000° C. by inserting the jig inside the heating oven (S73). Consequently, the filling material 22 and the lead terminal 21 as well as the filling material 22 and the stem 20 are sealed completely to have a structure that can withstand air-tightness. The airtight terminal 4 is obtained when pulled out from the jig. The airtight terminal manufacturing step ends at this point.

Subsequently, the plating step of coating the outer surfaces of the lead terminal 21 and the outer circumference of the stem 20 with metal films made of the same material is performed by means of wet plating (S80). To this end, as the pretreatment, the outer surfaces of the lead terminal 21 and the outer circumference of the stem 20 are rinsed and degreased using an alkaline solution, after which acid cleaning using solutions of hydrochloric acid and sulfuric acid is performed. After the pretreatment ends, a base metal film is formed on the outer surfaces of the lead terminal 21 and the outer circumference of the stem 20. For example, they are coated with a film of Cu plating or Ni plating with a film thickness of about 2 μm to 5 μm. A finishing metal film is then formed on the base metal film. For example, besides a single material, such as tin and silver, the base metal film is coated with a film of heat-resistant plating, tin-copper alloy, tin-bismuth alloy, tin-antimony alloy, and so forth with a film thickness of about 8 μm to 15 μm.

By providing the metal film made of the base metal film and the finishing metal film as the coating in this manner, connection between the inner lead 21*a* and the piezoelectric vibrating reed 2 can be achieved. In addition, because the metal film coated on the outer circumference of the stem 20 has a characteristic that it is so soft that it readily undergoes elastic deformation, not only the connection to the piezoelectric vibrating reed 2, but also cold-welding between the stem 20 and the case 3 can be achieved, which enables airtight joining.

Subsequently, in order to stabilize the metal film, annealing is performed under vacuum atmosphere in the oven (S90). For example, heating is performed at a temperature of 170° C. for one hour. It thus becomes possible to suppress the occurrence of whiskers by adjusting the composition of the intermetallic compound formed at the interface of the material forming the base metal film and the material forming the finishing metal film. The mounting step of mounting the piezoelectric vibrating reeds 2 can be performed after this annealing ends. A case where the metal films are coated by means of wet plating has been described by way of example. It should be appreciated, however, that the invention is not limited to this case, and the metal films may be coated, for example, by means of vapor deposition and chemical vapor deposition.

In this embodiment, when the annealing ends, conductive bumps B, such as gold, are formed at four points in the stepped portion formed at the tip end of the inner lead 21*a* for the mounting step performed next (S100). One mount electrode 13 formed on the under surface of the base portion 10*b* is disposed where the bumps B are formed. The inner lead 21*a* and the piezoelectric vibrating reed 2 are then superimposed at a specific pressure via the bumps B by heating the bumps B. Accordingly, the piezoelectric vibrating reed 2 can be mounted on the inner lead 21*a* (S110). In other words, the piezoelectric vibrating reed 2 is mechanically supported on the lead terminal 21 while one mount electrode 13 and the inner lead 21*a* are in an electrically connected state.

Mounting is performed by heating and applying a pressure for the bump connection. However, ultrasonic waves may be used for the bump connection.

Subsequently, the wire 5 is bonded between the other mount electrode 14 formed on the top surface of the base body 10*b* and the stem 20 (S120). Accordingly, the other mount electrode 14 and the stem 20 are brought into an electrically connected state via the wire 5. Subsequently, in order to eliminate deformation caused by the mounting, baking is performed at a predetermined temperature (S130). Subsequently, before the case 3 is fixed, the frequency tuning (fine tuning) of the piezoelectric vibrating reed 2 is performed (S140). To be more specific about the frequency tuning, the entire assembly is placed in a vacuum chamber and the piezoelectric vibrating reed 2 is vibrated by applying a voltage between the outer lead 21b and the stem 20. The frequency is tuned by letting the fine turning film of the weight metal film 16 evaporate with a laser beam while measuring the frequency. By performing the frequency tuning, it becomes possible to tune the frequency of the piezoelectric vibrating reed 2 so as to fall within the predetermined range of frequency.

The frequency tuning is performed by letting the weight metal film 16 evaporate with irradiation of a laser beam at the time of the fine tuning and the rough tuning performed earlier. However, argon ions may be used instead of a laser beam. In this case, the frequency tuning is performed by removing the weight metal film 16 by means of sputtering with irradiation of argon ions.

Subsequently, the encapsulating step of hermitically seal the piezoelectric vibrating reed 2 is performed by press-fitting the case 3 to the stem 20, so that the mounted piezoelectric vibrating reed 2 is accommodated inside (S150). To be more concrete, the case 3 is press-fit to the outer circumference of the stem 20 of the airtight terminal 4 under vacuum with an application of a predetermined load. Accordingly, the metal film formed on the outer circumference of the stem 20 undergoes elastic deformation and hermetical sealing is enabled by cold-welding. It thus becomes possible to encapsulate the piezoelectric vibrating reed 2 under vacuum inside the case 3 by means of hermetical sealing. In addition, by fixing the case 3, it becomes possible to bring the other mount electrode 14 and the case 3 into an electrically connected state.

It is preferable to eliminate surface absorbed moisture or the like by heating the piezoelectric vibrating reed 2, the case 3, and the airtight terminal 4 sufficiently before this step is performed.

Screening is then performed when the fixing of the case 3 ends (S160). Screening is performed in order to stabilize the frequency and the resonance resistance value and also to suppress the occurrence of metal whiskers resulting from compression stress in the fit portion where the case 3 is press-fit. When the screening ends, the internal electric characteristic test is conducted (S170). More specifically, the resonance frequency, the resonance resistance value, the drive level characteristic (the exciting power dependency of the resonance frequency and the resonance resistance value), and so forth of the piezoelectric vibrating reed 2 are measured and checked. The insulation resistance characteristic and the like are checked as well. Finally, the outward appearance test of the piezoelectric vibrator 1 is performed to check the dimension, the quality, and so forth for the last time. Consequently, a plurality of the piezoelectric vibrators 1 shown in FIG. 1 can be manufactured at a time.

In a case where the piezoelectric vibrator 1 configured as above is operated, a predetermined drive voltage is applied between the outer lead 21b and the case 3. A current is then flown into the exciting electrodes 11 and 12 via the mount electrodes 13 and 14, respectively, and the extraction electrodes 15, which allows a pair of the vibrating arms 10a to vibrate at a specific frequency. By utilizing the vibration of a pair of the vibrating arms 10a, the piezoelectric vibrator 1 can be used as the time source, the timing source of a control signal, the reference signal source, and so forth.

In particular, the piezoelectric vibrating reed 2 of this embodiment is not formed in the sandwich structure in which the base portion 10b is sandwiched by a pair of the mount electrodes 13 and 14 from the both surface sides as in the related art. Accordingly, when a predetermined voltage is applied to a pair of the mount electrodes 13 and 14, a pair of the mount electrodes 13 and 14 will not function as a capacitor as in the related art, and there is no risk that an electrostatic capacitance is accumulated between a pair of the mount electrodes 13 and 14. It thus becomes possible to prevent the R1 characteristic of the piezoelectric vibrating reed 2 in itself from becoming higher, and the R1 characteristic can be maintained at a low value as designed. Hence, the R1 characteristic can be maintained at as low a value as possible, and the tuning-fork piezoelectric vibrating reed 2 with the enhanced vibrating characteristic and thereby achieving higher performance can be obtained. The piezoelectric vibrator 1 itself thus becomes able to achieve higher performance.

Also, because the R1 characteristic can be maintained low, the effective resistance value Re of the piezoelectric vibrating reed 2 can be lowered, too. It thus becomes possible to operate the piezoelectric vibrator 1 efficiently, which can in turn save the power.

Further, because the piezoelectric vibrator 1 of this embodiment is of the cylinder package type in which the piezoelectric vibrating reed 2 is hermetically sealed inside the case 3, it is possible to vibrate the piezoelectric vibrating reed 2 without being affected by dust or the like. The piezoelectric vibrating reed 2 can be vibrated at high accuracy in this regard, too. Moreover, because the single lead terminal 21 is used, different from the case of using two lead terminals, there is no need to design the case 3 of a smaller size while ensuring the electric independence of the respective lead terminals. Hence, the airtight terminal 4 and the case 3 of a smaller size can be designed. For example, it is possible to achieve an ultra-compact case 3 having the diameter of 1.0 mm or smaller.

In the first embodiment, the piezoelectric vibrator 1 is formed by merely accommodating the piezoelectric vibrating reed 2 in the cylindrical case 3. However, as are shown in FIG. 13 through FIG. 16, the piezoelectric vibrator 1 of a surface-mounting type may be formed by packaging the periphery of the case 3 with a resin mold portion 35.

More specifically, the piezoelectric vibrator 1 in this case further includes the resin mold portion 35 and an external connection terminal 36. Also, the outer lead 21b in this case is bent twice almost at right angles, so that a part thereof is exposed to the bottom surface of the resin mold portion 35 and protrudes outward.

The external connection terminal 36 is formed of a plate-shaped conducting member bent at almost right angles to have a cross section in the shape of a letter L, and is located on the opposite side of the outer lead 21b with the case 3 in between. Herein, as with the outer lead 21b, a part of the external connection terminal 36 is exposed to the bottom surface of the resin mold portion 35 and protrudes outward. The rest of the external connection terminal 36 is disposed to oppose the end face of the case 3. The protrusion portion 3a of the case 3 can be pushed into this opposing portion, and the opposing portion is provided with a fitting groove 36a to hold the protrusion portion 3a by an elastic force when the protrusion portion 3a is pushed therein. Accordingly, the protrusion portion 3a and the external connection terminal 36 are mechanically connected firmly and also brought into an electrically connected state.

The resin mold portion 35 is formed by molding insulating resin (for example, heat curable resin, such as epoxy resin, and thermoplastic resin, such as liquid crystal polymers) almost in the shape of a rectangular prism. The case 3 is embedded therein while parts of the outer lead 21b and the external connection terminal 36 are exposed as described above. In this embodiment, a part of the resin mold portion 35 is cut diagonally on the outer lead 21*b* side, so that the orientation can be visually confirmed.

According to the piezoelectric vibrator 1 configured as above, because it has the resin mold portion 35, it can be mounted directly on the circuit board or the like, which facilitates the surface mounting. In particular, because parts of the outer lead 21*b* and the external connection terminal 36 are exposed to the bottom surface of the resin mold portion 35, it can sit well when mounted on the surface and the posture thereof is stabilized. The mounting work is thus facilitated. Moreover, because the resin mold portion 35 is cut diagonally on the outer lead 21*b* side, the mounting work can be performed in a reliable manner without making a mistake in orientation.

Figure 17:
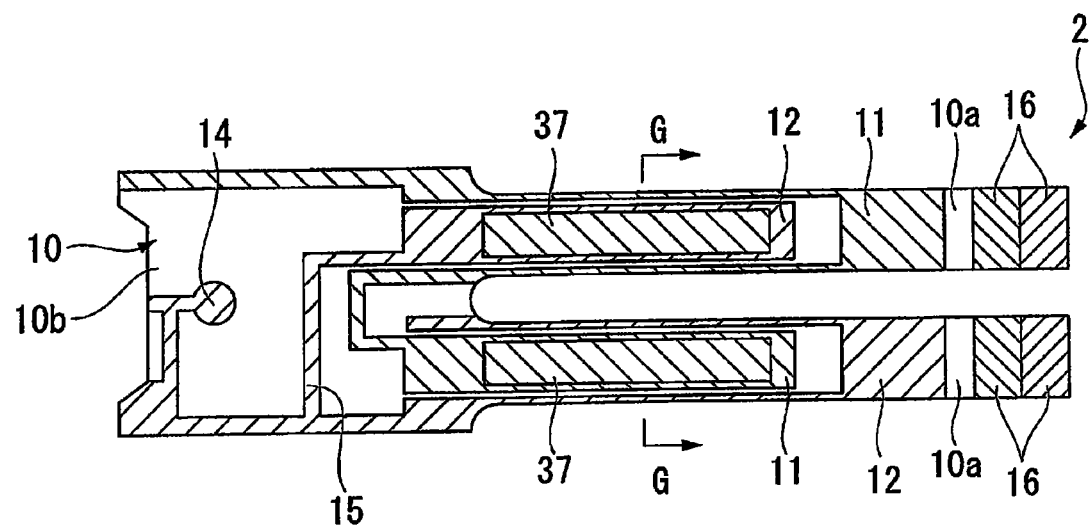
FIG. 17 is a top view of a piezoelectric vibrating reed provided with groove portions on the both surfaces of a pair of vibrating arms to show a modification of the piezoelectric vibrating reed of the first embodiment.
Figure 18:
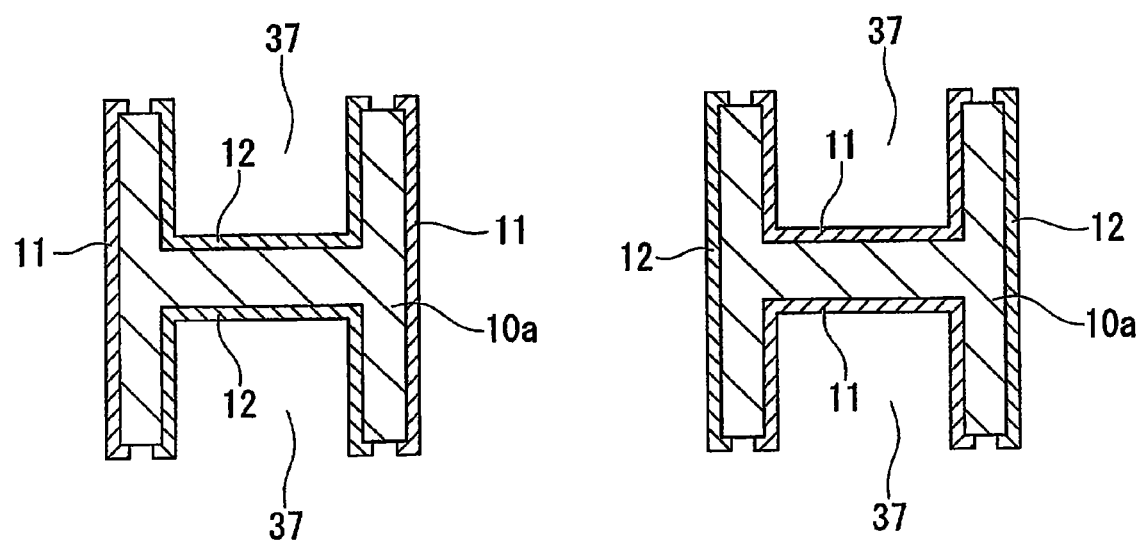
FIG. 18 is a cross section taken on line G-G of FIG. 17.

Also, in the first embodiment, as are shown in FIG. 17 and FIG. 18, the piezoelectric vibrating reed 2 with groove may be provided, in which groove portions 37 are formed on the both surfaces of a pair of the vibrating arms 10*a*.

The piezoelectric vibrating reed 2 in this case includes the groove portions 37 formed on the both surfaces of a pair of the vibrating arms 10*a* along the longitudinal direction of the vibrating arms 10*a*. Herein, each groove portion 37 is formed from the base end side to almost the intermediate point of the corresponding vibrating arm 10*a*. Also, one excitation electrode 11 is chiefly formed on the groove portions 37 in one vibrating arm 10*a* and on the both side surfaces of the other vibrating arm 10*a*, whereas the other excitation electrode 12 is chiefly formed on the both side surfaces of one vibrating arm 10*a* and on the groove portions 37 in the other vibrating arm 10*a*.

According to the piezoelectric vibrating reed 2 configured as above, because the groove portions 37 are formed, a pair of the excitation electrodes 11 and 12 can be brought into a state where they oppose each other to the extent possible. Hence, when a predetermined drive voltage is applied between a pair of the excitation electrodes 11 and 12, the field efficiency between a pair of the excitation electrodes 11 and 12 can be increased. Hence, because a vibration loss can be suppressed further, the vibration characteristic can be enhanced further. In other words, because the CI value can be reduced further, the piezoelectric vibrating reed 2 becomes able to achieve higher performance.

In order to form the groove portions 37, the groove portions 37 are formed on the both surfaces of a pair of the vibrating arms 10*a* by the photolithographic technique after the outer shapes of the piezoelectric plates 10 are patterned in the outer shape forming step.

Second Embodiment

A second embodiment of the invention will now be described with reference to FIG. 19 through FIG. 23. In the second embodiment, like components are labeled with like reference numerals with respect to the first embodiment and the descriptions of such components are omitted.

A difference between the second embodiment and the first embodiment is that a piezoelectric vibrator 40 of the second embodiment includes two lead terminals 21 in contrast to the first embodiment where the single lead terminal 21 is used. In addition, the second embodiment is also different in that a piezoelectric vibrating reed 41 of a hammer head type is used.

Figure 19:
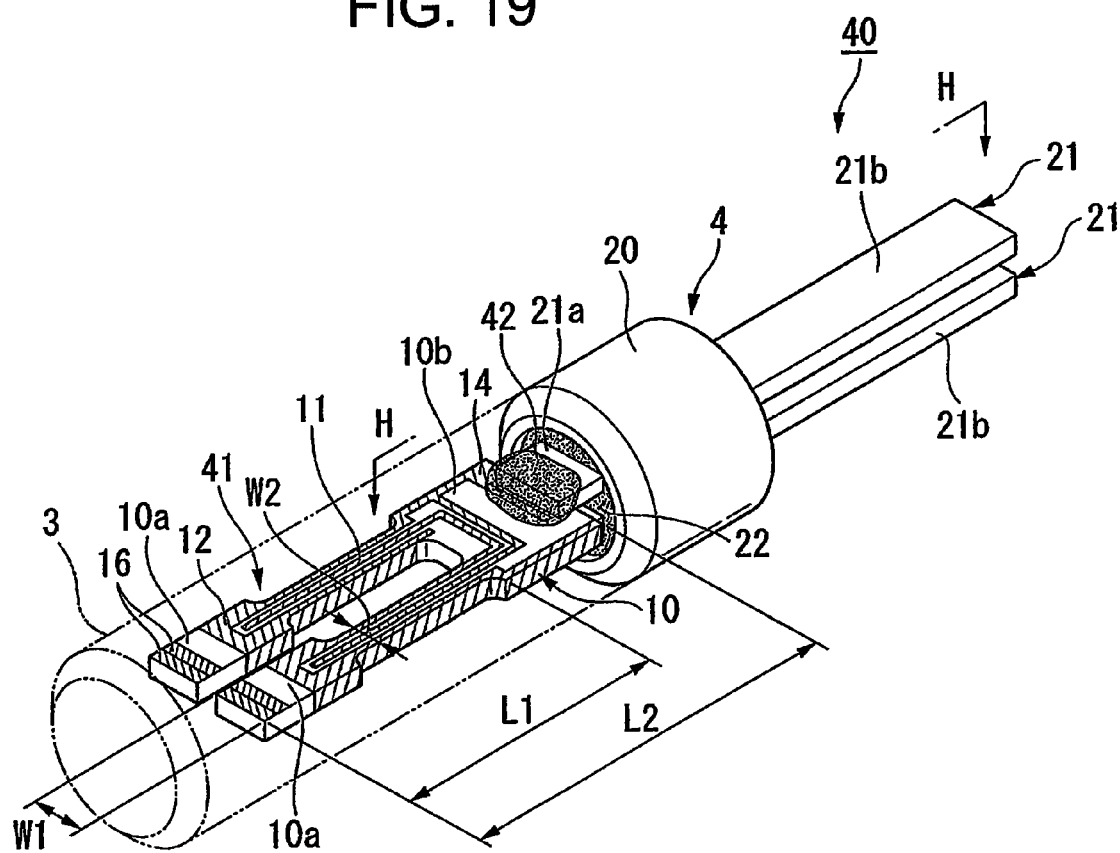
FIG. 19 is a perspective view showing a piezoelectric vibrator according to a second embodiment of the invention.

More specifically, as is shown in FIG. 19, the piezoelectric vibrating reed 41 of this embodiment is designed in such a manner that a pair of the vibrating arms 10*a* increases in width from almost the intermediate point toward the tip end and each corresponding portion forms a spindle portion. To be more specific, the width W1 of the spindle portion is nearly two times the width W2 at the intermediate point. Accordingly, a pair of the vibrating arms 10*a* is designed so that the inertia moment increases because of the spindle portions formed therein. Hence, the length L1 of a pair of the vibrating arms 10*a* can be shorter, which consequently makes it possible to design the total length L2 of the piezoelectric vibrating reed 41 shorter.

Figure 21:
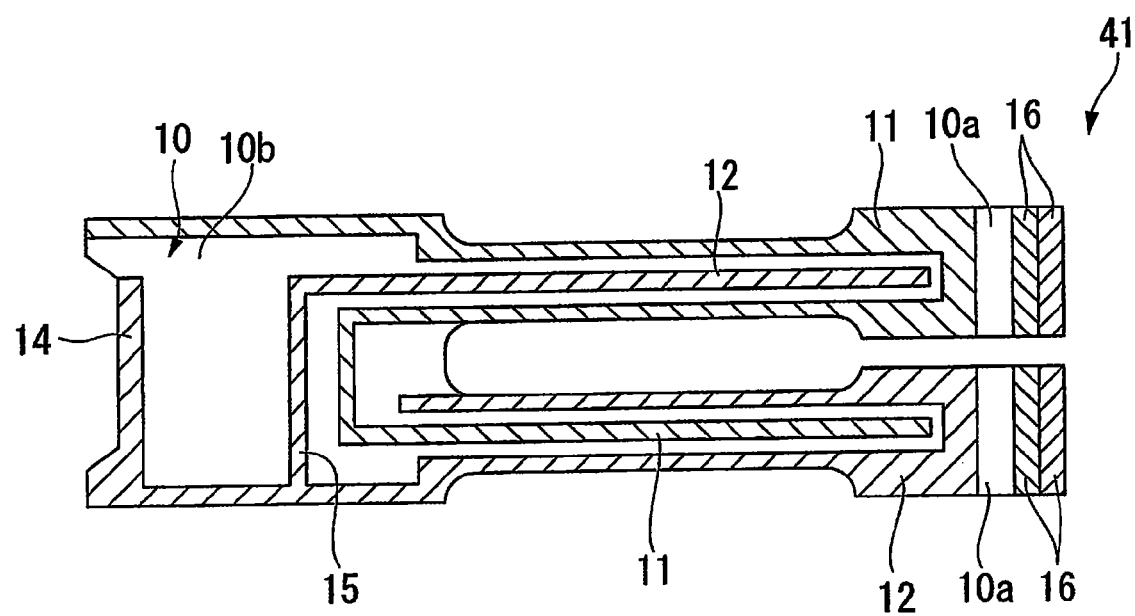
FIG. 21 is a view of the piezoelectric vibrating reed shown in FIG. 19 when viewed from above.
Figure 22:
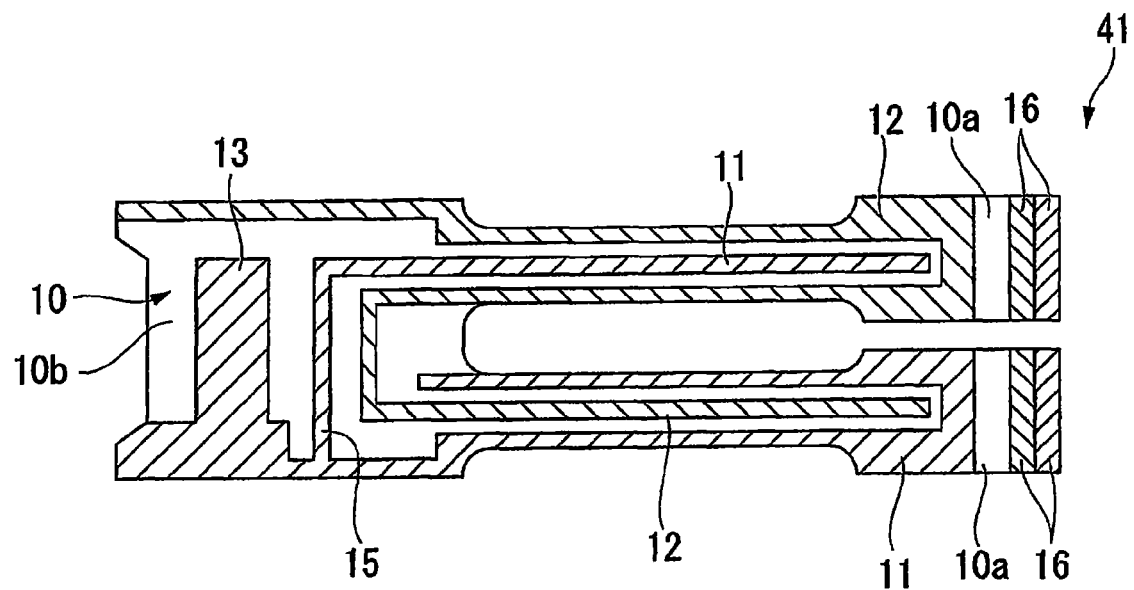
FIG. 22 is a view of the piezoelectric vibrating reed shown in FIG. 19 when viewed from below.

Even in the case of the piezoelectric vibrating reed 41 of this embodiment, as are shown in FIG. 21 and FIG. 22, one mount electrode 13 is formed on the under surface of the base portion 10*b* and the other mount electrode 14 is formed on the top surface of the base portion 10*b*. In addition, a pair of these mount electrodes 13 and 14 is formed in a state not to oppose each other with the base portion 10*b* in between and they do not overlap when viewed in a plane. FIG. 21 is a view of the piezoelectric vibrating reed 41 when viewed from above and FIG. 22 is a view of the piezoelectric vibrating reed 41 when viewed from below.

Figure 20:
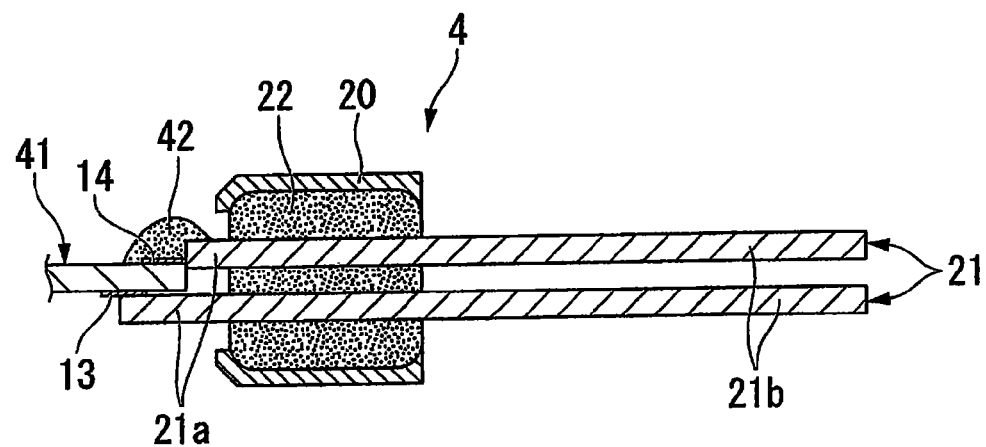
FIG. 20 is a cross section taken on line H-H of FIG. 19.
Figure 23:
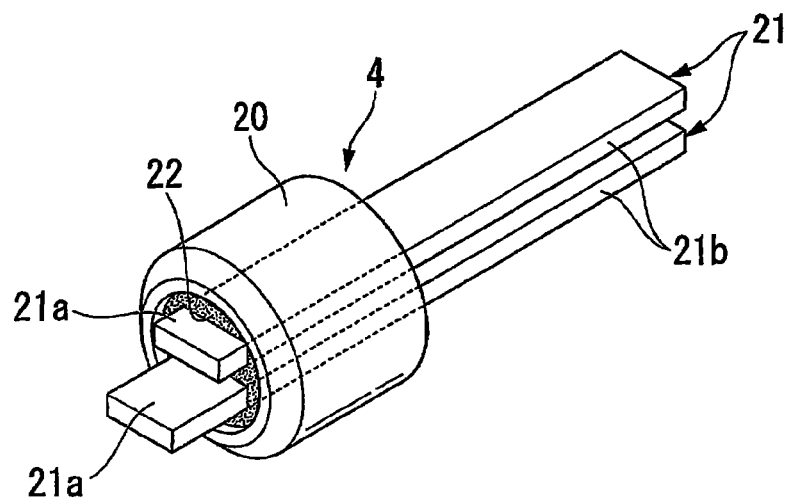
FIG. 23 is a perspective view of an airtight terminal shown in FIG. 19.

Also, as is shown in FIG. 23, the airtight terminal 4 of this embodiment includes two lead terminals 21 formed in the shape of a plate. These two lead terminals 21 protrude from the stem 20 in different lengths and the lengths of the inner leads 21*a* are different. Accordingly, as is shown in FIG. 20, one mount electrode 13 of the piezoelectric vibrating reed 41 is electrically and mechanically connected onto one inner lead 21*a* in a state of surface contact. One inner lead 21*a* and one mount electrode 13 are bump-connected using unillustrated bumps, such as gold.

Meanwhile, the other inner lead 21*a* abuts on the side surface of the base portion 10*b*. The other inner lead 21*a* and the other mount electrode 14 are electrically and mechanically connected using, for example, a conductive adhesive material 42. The conductive adhesive material 42 is, for example, a mixture of a binder component using synthetic resin and charged particles, such as silver particles, and can achieve both mechanical joining and electrical joining simultaneously.

In a case where the piezoelectric vibrating reed 40 configured in this manner is operated, a predetermined drive voltage is applied to the outer leads 21*b* of the two lead terminals 21. Accordingly, a current is flown into a pair of the excitation electrodes 11 and 12, which allows a pair of the vibrating arms 10*a* to vibrate at a specific frequency. Hence, in this embodiment, too, the same function and effect as those of the first embodiment can be achieved.

Third Embodiment

A third embodiment of the invention will now be described with reference to FIG. 24. In the third embodiment, like components are labeled with like reference numerals with respect to the first embodiment and the descriptions of such components are omitted.

A difference between the third embodiment and the first embodiment is that two lead terminals 21 are used in the third embodiment in contrast to the first embodiment where the single lead terminal 21 is used.

Figure 24:
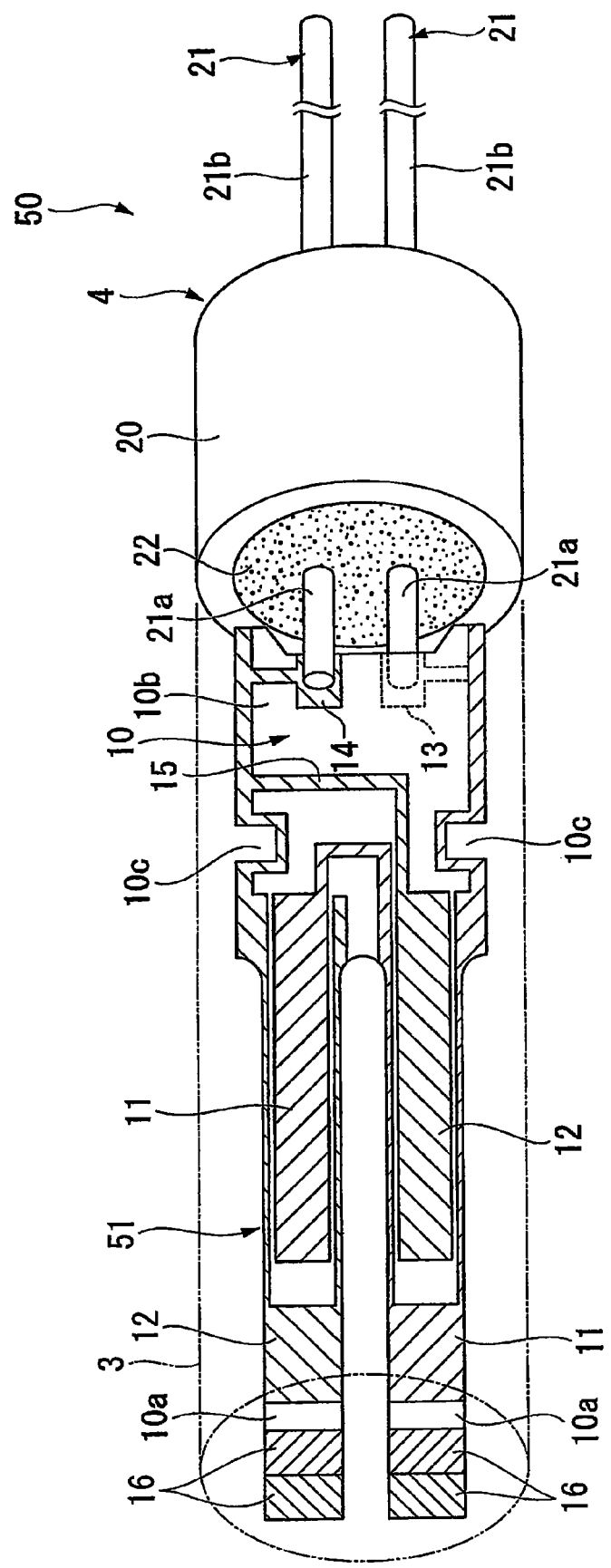
FIG. 24 is a cross section showing a piezoelectric vibrator according to a third embodiment of the invention.

More specifically, as is shown in FIG. 24, a piezoelectric vibrator 50 of this embodiment includes the airtight terminal 4 having two lead terminals 21. The two lead terminals 21 of this embodiment are formed in the shape of a cylindrical column and disposed so as to sandwich a piezoelectric vibrating reed 51 from the both surface sides. To be more specific, the inner lead 21*a* of one lead terminal 21 is disposed on the under surface side of the piezoelectric vibrating reed 51 and the inner lead 21a of the other lead terminal 21 is disposed on the top surface side of the piezoelectric vibrating reed 51. Accordingly, the piezoelectric vibrating reed 51 is mechanically fixed by the two lead terminals 21 in a state where one inner lead 21a is electrically connected to one mount electrode 13 and the other inner lead 21a is electrically connected to the other mount electrode 14.

Even in the case of the piezoelectric vibrating reed 51 of this embodiment, one mount electrode 13 is formed on the under surface of the base portion 10b and the other mount electrode 14 is formed on the top surface of the base portion 10b depending on the positions of the two lead terminals 21. In addition, a pair of these mount electrodes 13 and 14 is formed in a state not to oppose each other with the base portion 10b in between and therefore they do not overlap when viewed in plane.

In a case where the piezoelectric vibrator 50 configured in this manner is operated, a predetermined drive voltage is applied to the outer leads 21b of the two lead terminals 21. Accordingly, a current is flown into a pair of the excitation electrodes 11 and 12, which allows a pair of the vibrating arms 10a to vibrate at a specific frequency. Hence, in the case of this embodiment, too, the same function and effect as those of the first embodiment can be achieved.

Notch portions (hereinafter, referred to as the notches) 10c are formed on the both sides of the base portion 10b of the piezoelectric vibrating reed 51 of this embodiment so that the width dimension of the base portion 10b can be shortened in part. These notches 10c are formed at positions appropriately spaced apart from a pair of the vibrating arms 10a. These notches 10c are to reduce a variance of the resonance resistance value by suppressing deflection of the base portion 10b resulting from the vertical component of vibrations (components in the thickness direction) when a pair of the vibrating arms 10a vibrates. These notches 10c are not essential. However, it is preferable to form these notches 10c in achieving higher performance.

Figure 25:
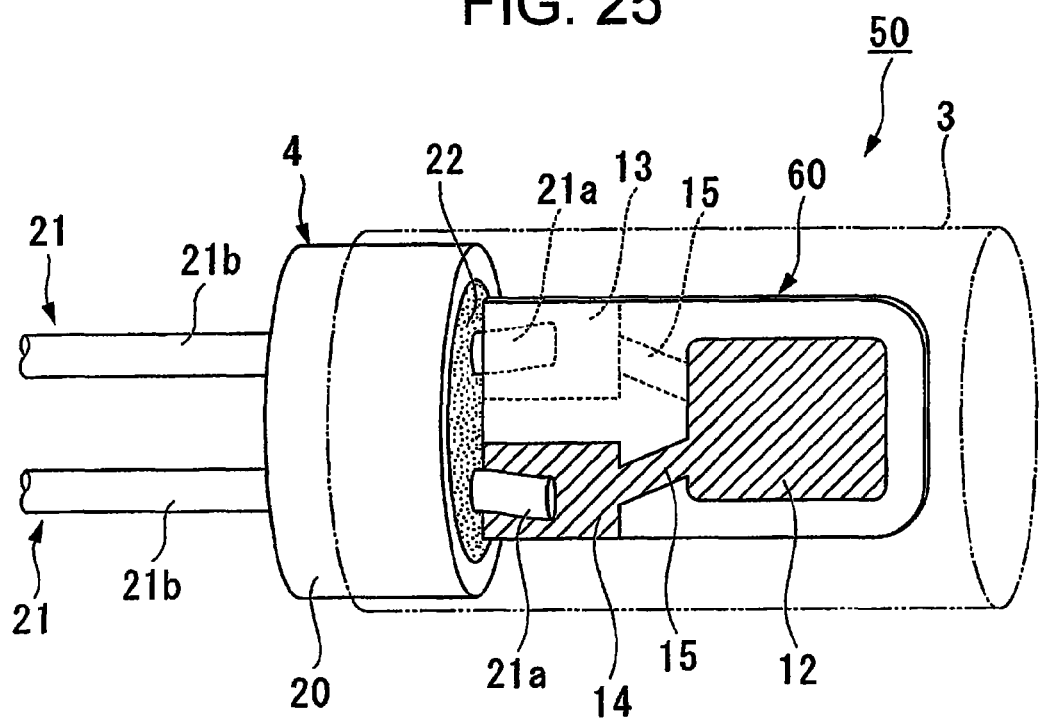
FIG. 25 is a cross section of a piezoelectric vibrator having a piezoelectric vibrating reed that undergoes thickness-shear vibration to show a modification of the piezoelectric vibrator of the third embodiment.

The third embodiment has described the tuning-fork piezoelectric vibrating reed 51 by way of example. However, the invention is not limited to a tuning-fork type, and for example, as is shown in FIG. 25, the invention can be also applied to a piezoelectric vibrating reed 60 that vibrates in the thickness-shear mode. The same can be said about the first embodiment and the second embodiment above.

One embodiment of an oscillator of the invention will now be described with reference to FIG. 26.

Figure 26:
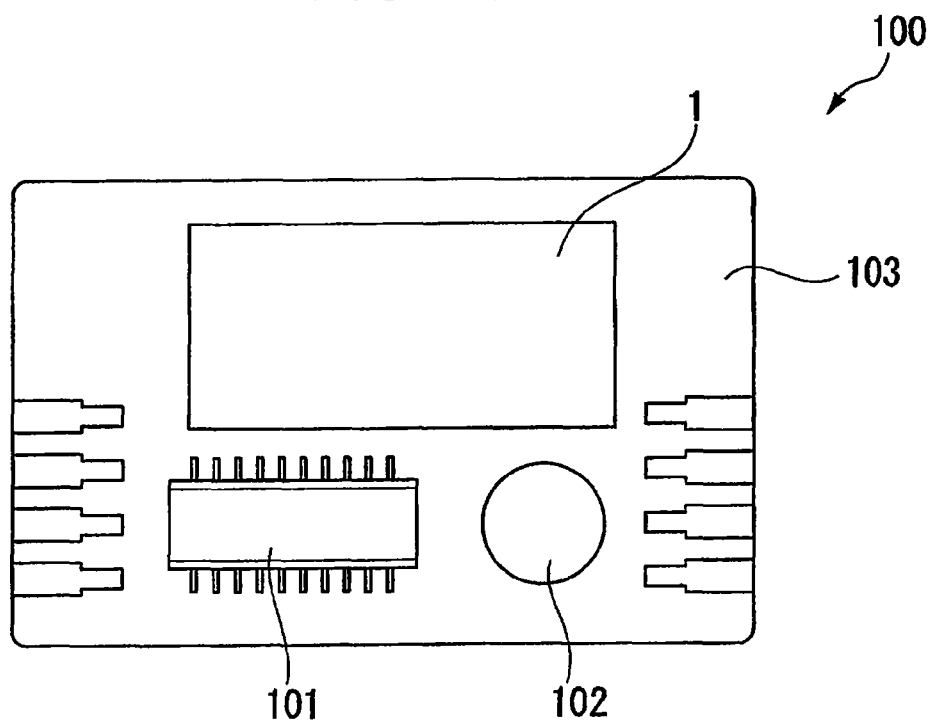
FIG. 26 is a view showing the configuration of one embodiment of an oscillator of the invention.

As is shown in FIG. 26, an oscillator 100 of this embodiment is formed using the piezoelectric vibrator 1 as a resonator electrically connected to an integrated circuit 101. The oscillator 100 includes a printed circuit board 103 on which is mounted an electronic component 102, such as a capacitor. The integrated circuit 101 for oscillator is mounted on the printed circuit board 103 and the piezoelectric vibrating reed 2 of the piezoelectric vibrator 1 is mounted in the vicinity of the integrated circuit 101. These electronic component 102, integrated circuit 101, and piezoelectric vibrator 1 are electrically interconnected by an unillustrated wiring pattern. It should be noted that these components are molded by unillustrated resin.

In the oscillator 100 configured in this manner, the piezoelectric vibrating reed 2 inside the piezoelectric vibrator 1 vibrates when a voltage is applied to the piezoelectric vibrator 1. This vibration is converted to an electric signal by the piezoelectric characteristic of the piezoelectric vibrating reed 2 and inputted into the integrated circuit 101 as the electric signal. The input electric signal is subjected to various kinds of processing by the integrated circuit 101 and is then outputted as a frequency signal. The piezoelectric vibrator 1 thus functions as a resonator.

By selectively setting the configuration of the integrated circuit 101, for example, an RTC (Real Time Clock) module, to suit the demand, it is possible to add the function to control the operating date or time of the device or an external device or to provide the time or a calendar in addition to the single-function oscillator for clock.

As has been described, according to the oscillator 100 of this embodiment, because it includes the piezoelectric vibrator 1 described as above, the oscillator 100 itself becomes able to save power and achieve higher performance, which can enhance the reliability of the device. In addition, it becomes possible to obtain a frequency signal at high accuracy in a stable manner over a long period of time.

One embodiment of an electronic device of the invention will now be described with reference to FIG. 27. As an example of the electronic device, descriptions will be given to a personal digital assistance 110 having the piezoelectric vibrator 1 described above. The personal digital assistance 110 of this embodiment is represented, for example, by a cell-phone and it is a developed and improved version of a wrist watch in the related art. It looks like a wrist watch on the outward appearance and a liquid crystal display is provided to the portion corresponding to the dial plate and is capable of displaying the current time or the like on this screen. In a case where it is used as a communication tool, the user removes it from the wrist and makes communications as with a cell-phone in the related art using the internal speaker and microphone on the inner side of the band. It is particularly worth noting that the size and the weight are reduced markedly in comparison with a cell-phone in the related art.

The configuration of the personal digital assistance 110 of this embodiment will now be described.

Figure 27:
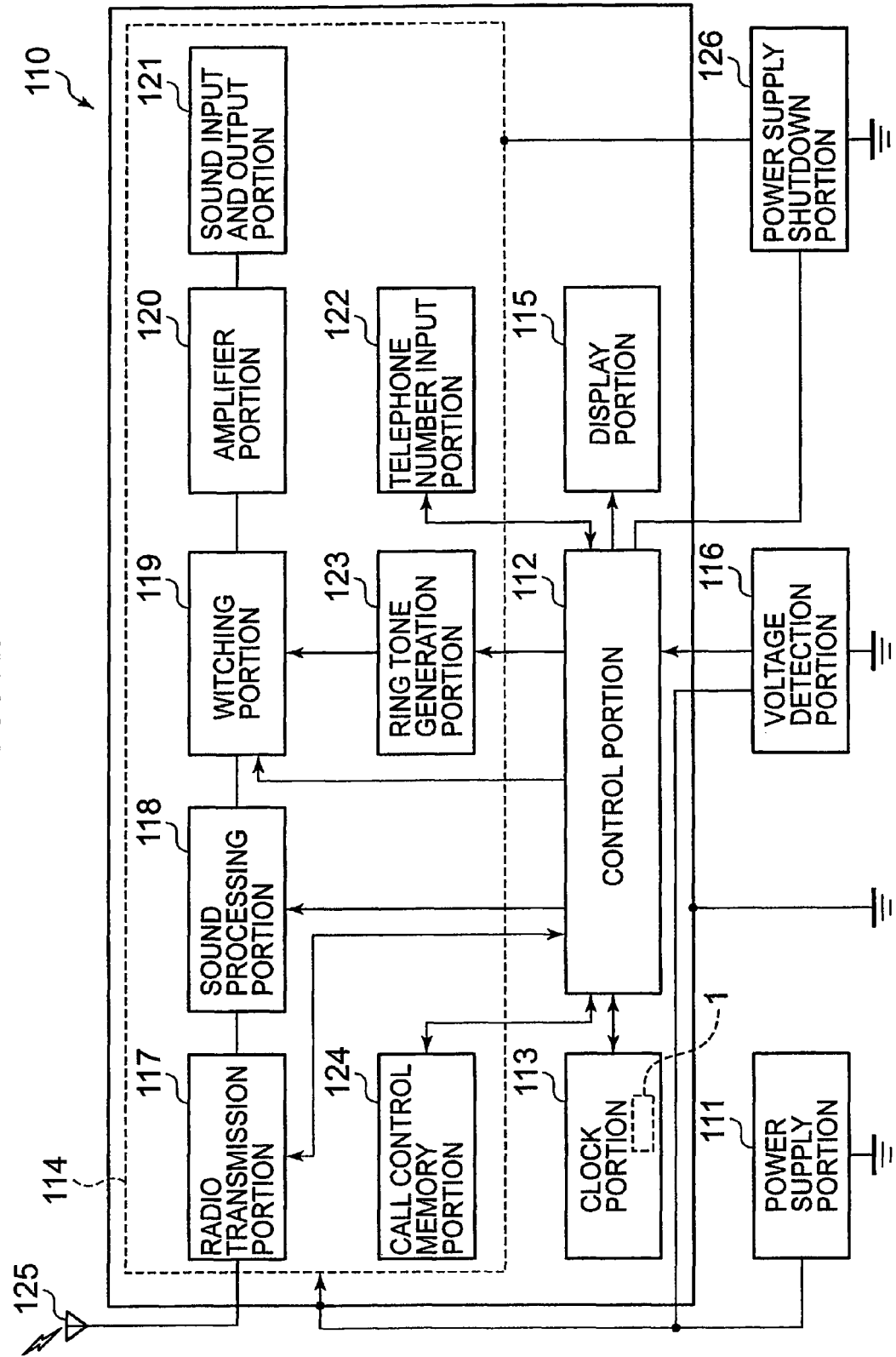
FIG. 27 is a view showing the configuration of one embodiment of an electronic device of the invention.

As is shown in FIG. 27, the personal digital assistance 110 includes the piezoelectric vibrator 1 and a power supply portion 111 to supply power. The power supply portion 111 is formed, for example, of a lithium rechargeable battery. A control portion 112 that performs various kinds of control, a clock portion 113 that counts the time or the like, a communication portion 114 that makes communications with the outside, a display portion 115 that displays various kinds of information, and a voltage detection portion 116 that detects voltages at the respective function portions, are connected in parallel to the power supply portion 111. Power is thus supplied to the respective function portions by the power supply portion 111.

The control portion 112 controls the respective function portions so as to control operations of the overall system, such as operations to transmit and receive sound data and operations to count and display the current time. The control portion 112 includes a ROM in which a program is pre-installed, a CPU that reads out and runs the program installed in the ROM, a RAM used as a work area of the CPU, and so forth.

The clock portion 113 includes an integrated circuit enclosing an oscillation circuit, a register circuit, a counter circuit, and an interface circuit, and so forth as well as the piezoelectric vibrator 1. When a voltage is applied to the piezoelectric vibrator 1, the piezoelectric vibrating reed 2 vibrates, and this vibration is converted to an electric signal by the piezoelectric characteristic of the quartz and inputted into the oscillation circuit as the electric signal. The output of the oscillation circuit is converted to a digital form and counted by the register circuit and the counter circuit. Transmission and reception of signals are carried out with the control portion 112 via the interface circuit, and the current time and the current date or the calendar information is displayed on the display portion 115.

The communication portion 114 is furnished with the same functions as those of the cell-phone in the related art, and includes a radio transmission portion 117, a sound processing portion 118, a switching portion 119, an amplifier portion 120, a sound input and output portion 121, a telephone number input portion 122, a ring tone generation portion 123, and a call control memory portion 124.

The radio transmission portion 117 carries out transmission and reception of various kinds of data, such as sound data, with the base station via an antenna 125. The sound processing portion 118 encodes and decodes a sound signal inputted therein from the radio transmission portion 117 or the amplifier portion 120. The amplifier portion 120 amplifies a signal inputted therein from the sound processing portion 118 or the sound input and output portion 121 to a specific level. The sound input and output portion 121 is formed of a speaker and a microphone, and makes a ring tone and an incoming sound louder as well as collects sounds.

The ring tone generation portion 123 generates a ring tone in response to a call from the base station. The switching portion 119 switches the amplifier portion 120 normally connected to the sound processing portion 118 to the ring tone generation portion 123 only when a call arrives, so that the ring tone generated in the ring tone generation portion 123 is outputted to the sound input and output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, about 3 V. Upon receipt of a notification of a voltage drop from the voltage detection portion 116, the control portion 112 disables the operation of the radio transmission portion 117, the sound processing portion 118, the switching portion 119, and the ring tone generation portion 123. In particular, it is essential to stop the operation of the radio transmission portion 117 that consumes a large amount of power. Further, a message informing that the communication portion 114 becomes unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, it may be displayed by putting a cross on the telephone icon displayed at the top of the display screen of the display portion 115.

By providing a power supply shutdown portion 126 capable of selectively shutting down the power supply to portions involved with the function of the communication portion 114, it is possible to stop the function of the communication portion 114 in a more reliable manner.

As has been described, according to the personal digital assistance 110 of this embedment, because it includes the piezoelectric vibrator 1 described as above, the personal digital assistance 110 itself becomes able to save power and achieve higher performance, which can enhance the reliability of the device. In addition, it is possible to display clock information at high accuracy in a stable manner over a long period of time.

One embodiment of a wave clock 130 of the invention will now be described with reference to FIG. 28.

Figure 28:
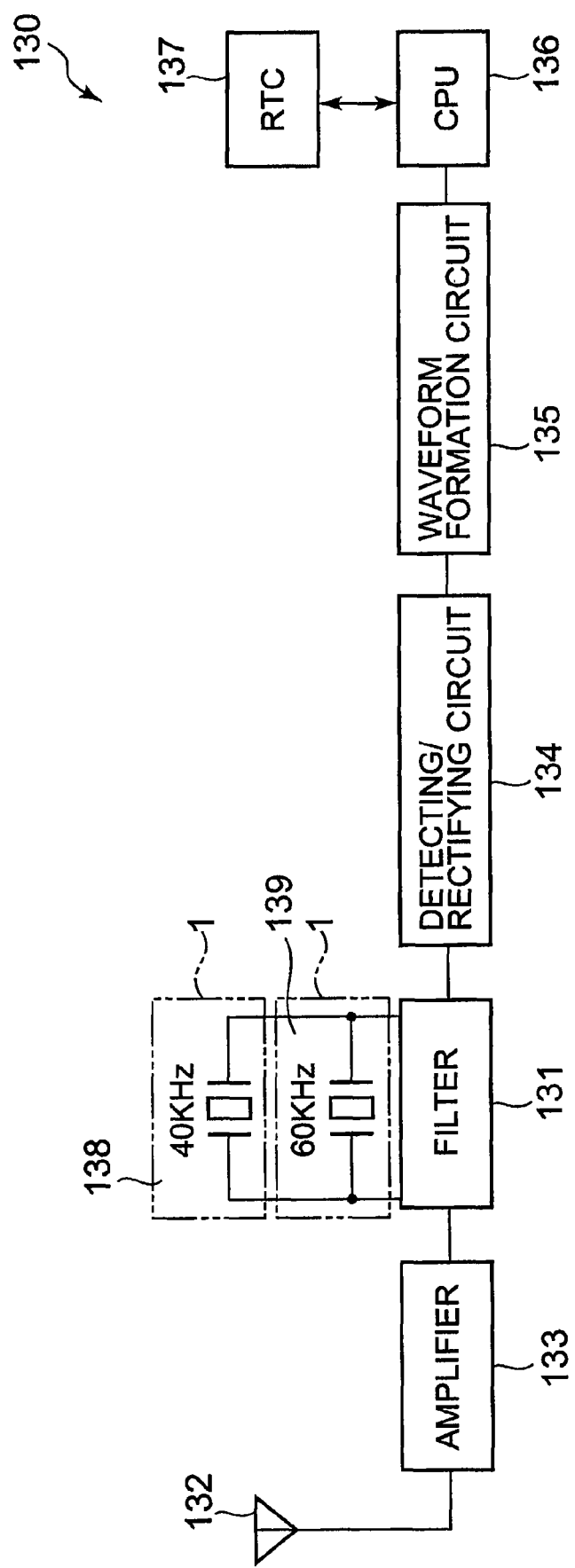
FIG. 28 is a view showing the configuration of one embodiment of a wave clock of the invention.
Figure 29:
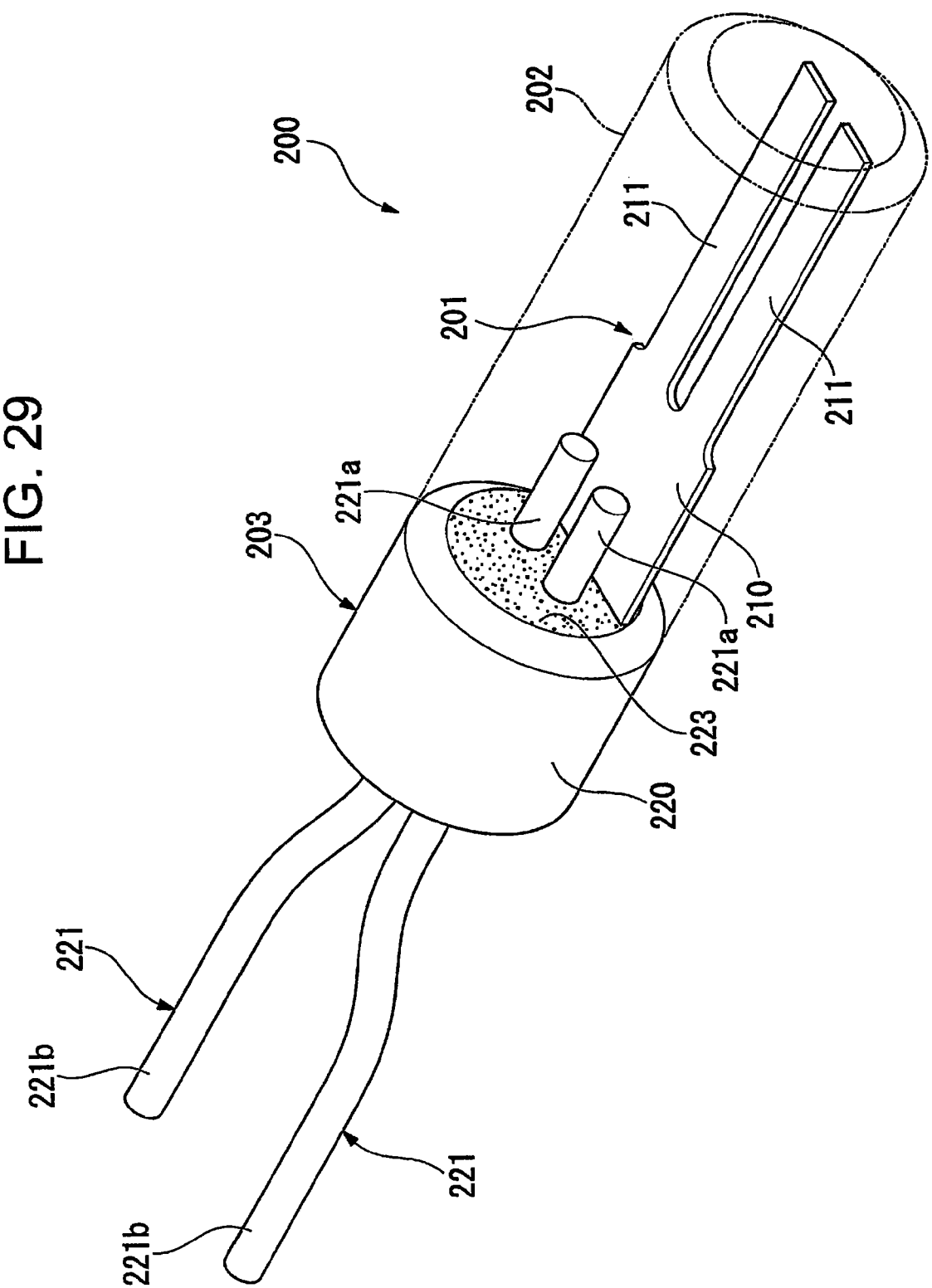
FIG. 29 is a perspective view showing an example of a piezoelectric vibrator in the related art.
Figure 30:
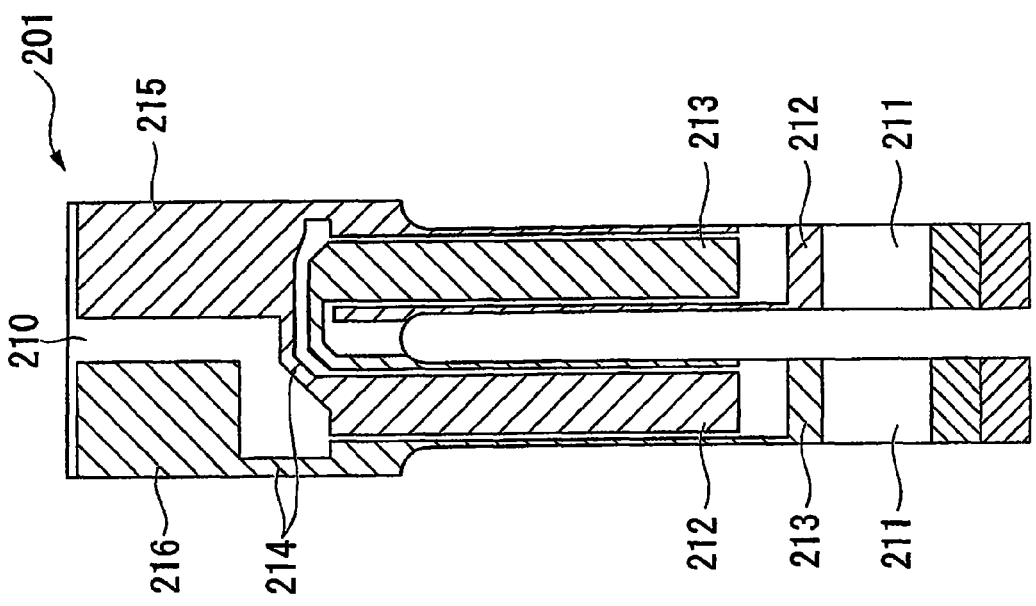
FIG. 30 is a view of a piezoelectric vibrating reed shown in FIG. 29 when viewed from above.
Figure 31:
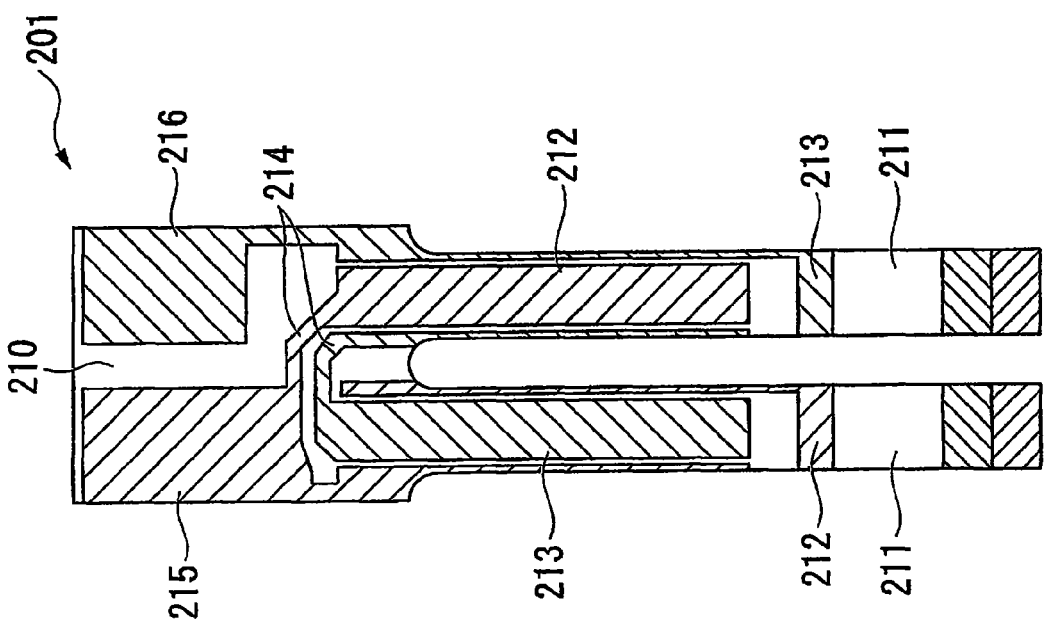
FIG. 31 is a view of the piezoelectric vibrating reed shown in FIG. 29 when viewed from below.

As is shown in FIG. 28, the wave clock 130 of this embodiment includes the piezoelectric vibrators 1 electrically connected to a filter portion 131, and it is a clock furnished with the function to display the correct time by automatically correcting the time upon receipt of a standard radio wave including the clock information.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz has a nature to propagate along the land surface and a nature to propagate while reflecting between the ionospheric layer and the land surface, and therefore has a propagation range wide enough to cover all over Japan by the two transmission centers.

Hereinafter, the functional configuration of the wave clock 130 will be described more in detail.

An antenna 132 receives the long standard radio wave at 40 kHz or 60 kHz. The long standard radio wave is made up of time information called a time code modulated by the AM modulation scheme on a carrier at 40 kHz or 60 kHz. The received long standard wave is amplified by an amplifier 133 and filtered and synchronized by the filter portion 131 having a plurality of piezoelectric vibrators 1.

In this embodiment, the piezoelectric vibrators 1 include quartz vibrator portions 138 and 139 respectively having resonance frequencies at 40 kHz and 60 kHz same as the carrier frequency.

Further, the filtered signal at the specific frequency is detected and decoded by a rectifying detector circuit 134. Subsequently, the time code is extracted by a waveform shaping circuit 135 and counted by the CPU 136. The CPU 136 reads out information about the current year, the total number of days, a day of the week, and the time. The read information is reflected on the RTC 137 and the precise time information is displayed.

Because the carrier is at 40 kHz or 60 kHz, a vibrator having the tuning-fork structure as described above is suitable for the quartz vibrator portions 138 and 139.

Descriptions have been given using an example in Japan. However, the frequency of the long standard wave is different in overseas. For example, a standard wave at 77.5 kHz is used in Germany. In order to incorporate the wave clock 130 also operable in overseas into a mobile device, the piezoelectric vibrator 1 set at the frequency different from the frequencies used in Japan has to be incorporated.

As has been described, according to the wave clock 130 of this embodiment, because it includes the piezoelectric vibrators 1 described as above, the wave clock 130 itself becomes able to save power and achieve higher performance, which can enhance the reliability of the device. In addition, it is possible to count the time at high accuracy in a stable manner over a long period of time.

According to the piezoelectric vibrating reed and the manufacturing method of the piezoelectric vibrating reed of the invention, not only is it possible to save power, but it is also possible to obtain a high-performance piezoelectric vibrating reed with the lower R1 characteristic and hence the enhanced vibration characteristic. Moreover, because only the electrode pattern of a pair of the mount electrodes has to be changed, the piezoelectric vibrating reed can be manufactured readily at a low cost and readily adapted to a size reduction of a piezoelectric vibrator.

According to the piezoelectric vibrator, the oscillator, the electronic device, and the wave clock of the invention, because each includes the piezoelectric vibrating reed described above, it is possible to save power and achieve higher performance as with the piezoelectric vibrating reed.

It should be appreciated that the technical field of the invention is not limited to the embodiments above and the invention can be modified in various manners without deviating from the scope of the invention.

What is claimed is:

1. A piezoelectric vibrating reed comprising:
   a piezoelectric plate comprising a piezoelectric material and having first and second opposing surfaces;
   a pair of excitation electrodes on outer surfaces of the piezoelectric plate and configured to vibrate the piezoelectric plate when a predetermined voltage is applied thereto; and
   a pair of mount electrodes electrically connected to the pair of excitation electrodes, respectively,
   wherein a first mount electrode of the pair of mount electrodes resides on the first surface of the piezoelectric plate and a second mount electrode resides on the second surface of the piezoelectric plate,
   wherein the first and second mount electrodes comprise non-overlapping inverse patterns with respect to one another.

2. The piezoelectric vibrating reed according to claim 1, wherein:
   the piezoelectric plate includes a pair of vibrating arms disposed parallel to each other and a base portion to which the pair of vibrating arms is fixed integrally on a base end side;
   the pair of excitation electrodes are positioned on outer surfaces of the pair of vibrating arms; and
   the first and second mount electrodes reside on the base portion.

3. The piezoelectric vibrating reed according to claim 2, wherein:
   the pair of vibrating arms each include groove portions on both surfaces thereof.

4. A piezoelectric vibrator, comprising the piezoelectric vibrating reed set forth in claim 1.

5. The piezoelectric vibrator according to claim 4, further comprising:
   a conductive case configured to accommodate the piezoelectric vibrating reed inside;
   an airtight terminal having a conductive stem formed in an annular shape to be press-fit and fixed in the case, a single lead terminal disposed to penetrate through the stem and serving as an inner lead to be electrically connected to the one mount electrode on one end side with the stem in between and serving as an outer lead to be electrically connected to an outside on the other end side, and a filling material fixing the lead terminal and the stem; and
   a wire configured to electrically connect the stem and the other mount electrode inside the case.

6. The piezoelectric vibrator according to claim 4, further comprising:
   a case configured to accommodate the piezoelectric vibrating reed inside; and
   an airtight terminal configured to hermetically seal an interior of the case and having a stem formed in an annular shape to be press-fit and fixed in the case, two lead terminals disposed to penetrate through the stem and serving as inner leads to be electrically connected, respectively, to the first and second mount electrodes on one end side with the stem in between and serving as outer leads providing an external electrical connection on the other end side, and a filling material fixing the lead terminal and the stem.

7. An oscillator, comprising:
   the piezoelectric vibrator set forth in claim 4,
   wherein the piezoelectric vibrator is electrically connected to an integrated circuit as a resonator.

8. An electronic device, comprising:
   the piezoelectric vibrator set forth in claim 4,
   wherein the piezoelectric vibrator is electrically connected to a clock portion.

9. A wave clock, comprising:
   the piezoelectric vibrator set forth in claim 4,
   wherein the piezoelectric vibrator is electrically connected to a filter portion.

10. The piezoelectric vibrating reed according to claim 1, wherein the first and second mount electrodes are arranged such that an electrostatic capacitance does not arise between the first and second mount electrodes.

11. The piezoelectric vibrating reed according to claim 1, wherein the first and second mount electrodes have opposite polarities.

* * * * *